(12) United States Patent
Masada et al.

(10) Patent No.: US 10,975,496 B2
(45) Date of Patent: Apr. 13, 2021

(54) SINGLE CRYSTAL SILICON PLATE-SHAPED BODY

(71) Applicant: Tokuyama Corporation, Yamaguchi (JP)

(72) Inventors: Isao Masada, Yamaguchi (JP); Shoji Tachibana, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 115 days.

(21) Appl. No.: 16/315,216

(22) PCT Filed: Jun. 30, 2017

(86) PCT No.: PCT/JP2017/024235
§ 371 (c)(1),
(2) Date: Jan. 4, 2019

(87) PCT Pub. No.: WO2018/008561
PCT Pub. Date: Jan. 11, 2018

(65) Prior Publication Data
US 2019/0161888 A1 May 30, 2019

(30) Foreign Application Priority Data
Jul. 6, 2016 (JP) .............................. JP2016-134375

(51) Int. Cl.
*C30B 29/06* (2006.01)
*C30B 15/00* (2006.01)
(Continued)

(52) U.S. Cl.
CPC .............. *C30B 29/06* (2013.01); *C01B 33/02* (2013.01); *C30B 15/00* (2013.01); *C30B 15/206* (2013.01);
(Continued)

(58) Field of Classification Search
CPC ....... C30B 29/06; C30B 15/00; C30B 15/206; C01B 33/02; C01P 2006/80; H01L 31/1804
(Continued)

(56) References Cited

U.S. PATENT DOCUMENTS 5,704,973 A    1/1998  Sakurada et al.
6,277,501 B1 *  8/2001  Fujikawa ................ C30B 15/00
                                                     117/13
(Continued)

FOREIGN PATENT DOCUMENTS

JP    3-133121 A    6/1991
JP    7-89789 A     4/1995
(Continued)

OTHER PUBLICATIONS

English Abstract of JP 2003051504A, Feb. 21, 2003.
(Continued)

*Primary Examiner* — Colin W. Slifka
(74) *Attorney, Agent, or Firm* — Cahn & Samuels, LLP

(57) ABSTRACT

A single crystal silicon plate-shaped body as cut out from an upper portion of a straight body portion of a CZ method single crystal silicon ingot has an interstitial oxygen concentration in a crystal is 25 ppma to 45 ppma and a substitutional carbon concentration is 0.5 ppma or less in a radial center. In the radial center, oxygen precipitates are not observed in a bulk in an image of 200,000 times by a transmission electron microscope, and after heating the single crystal silicon plate-shaped body at 950° C. for 60 minutes, oxygen precipitates are observed in an image of the 200,000 times, and a shape of the oxygen precipitates is observed in a polyhedral structure in an image of 2,000,000 times.

10 Claims, 5 Drawing Sheets

(51) Int. Cl.
  *C01B 33/02* (2006.01)
  *C30B 15/20* (2006.01)
  *H01L 31/18* (2006.01)

(52) U.S. Cl.
  CPC ...... *C01P 2006/80* (2013.01); *H01L 31/1804* (2013.01)

(58) Field of Classification Search
  USPC .......................................................... 423/348
  See application file for complete search history.

(56) References Cited

U.S. PATENT DOCUMENTS

| | | | |
|---|---|---|---|
| 6,328,795 | B2 | 12/2001 | Falster et al. |
| 6,544,656 | B1 * | 4/2003 | Abe .................. C30B 15/00 428/446 |
| 6,913,647 | B2 | 7/2005 | Falster et al. |
| 7,141,113 | B1 * | 11/2006 | Nakamura .............. C30B 29/06 117/3 |
| 2001/0008114 | A1 | 7/2001 | Falster et al. |
| 2001/0055689 | A1 | 12/2001 | Park et al. |
| 2003/0044622 | A1 | 3/2003 | Park et al. |
| 2003/0068890 | A1 | 4/2003 | Park et al. |
| 2003/0164139 | A1 * | 9/2003 | Kobayashi .............. C30B 29/06 117/84 |
| 2005/0247259 | A1 | 11/2005 | Yoon et al. |
| 2007/0169688 | A1 | 7/2007 | Yoon et al. |
| 2008/0118424 | A1 * | 5/2008 | Sadamitsu .............. C30B 33/02 423/324 |

FOREIGN PATENT DOCUMENTS

| | | | |
|---|---|---|---|
| JP | 3006669 | B2 | 1/1997 |
| JP | H9-190954 | A | 7/1997 |
| JP | 11-43393 | A | 2/1999 |
| JP | 11-92274 | A | 4/1999 |
| JP | 2003051504 | A | 2/2003 |
| JP | 2005322875 | A | 11/2005 |
| JP | 2010-30856 | A | 2/2010 |
| JP | 2010161393 | A | 7/2010 |
| JP | 2011-228459 | A | 11/2011 |
| WO | 03060982 | A2 | 7/2003 |

OTHER PUBLICATIONS

English Abstract of JP 2005322875A, Nov. 17, 2005.
English Abstract of JP 2010161393A, Jul. 22, 2010.
Kamiura, "Basic Properties of Defects in Silicon and Their Characterizing Techniques," Realize Science & Engineering, May 30, 1997, pp. 59-60.
Partial English translation of Kamiura, p. 59, line 26—p. 60, line 13.
Shimura, "Semiconductor Silicon Crystal Technology," Mruzen, 1993, pp. 294-303.
Partial English translation of Shimura, p. 298, line 12—p. 299, line 6.
English translation of International Preliminary Report on Patentability, dated Nov. 2018.
PCT/JP2017/024235, International Search Report, dated Sep. 2017.
English Abstract of JP 11-43393, Feb. 16, 1999.
English Abstract of JP 11-92274, Apr. 6, 1999.
English Abstract of JP 2003-517412, May 27, 2003.
English Abstract of JP 7-89789, Apr. 4, 1995.
English Abstract of JP 3-133121, Jun. 6, 1991.
English Abstract of JP 2010-30856, Feb. 12, 2010.
English Abstract of JP 2011-228459, Nov. 10, 2011.
English Abstract of JP H9-190954, Jul. 22, 1997.
English Abstract of JP H092891, Jan. 7, 1997 (corresponding to JP 300666962).

* cited by examiner

[Figure 1]
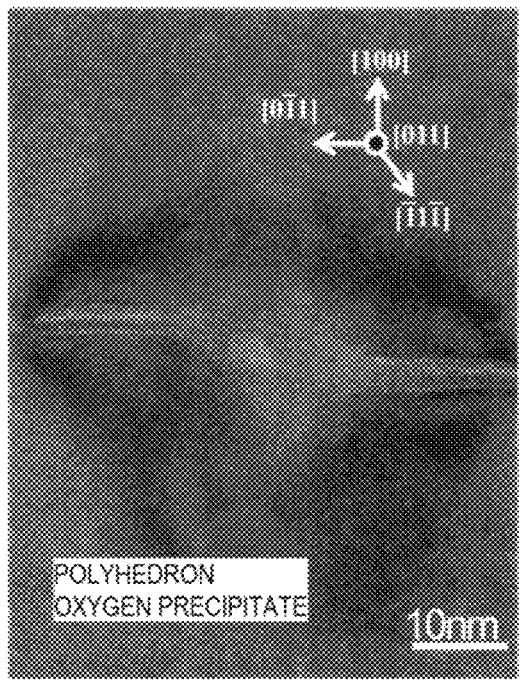
SINGLE CRYSTAL SILICON PRODUCED IN EXAMPLE 1
(a) TEM IMAGE
[Figure 2]
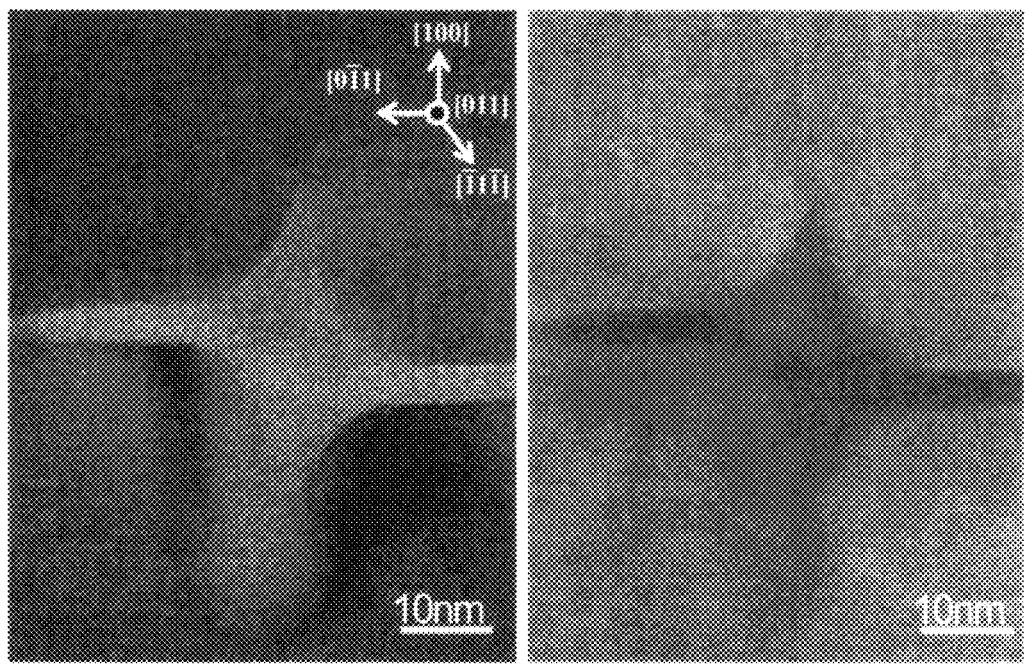
SINGLE CRYSTAL SILICON PRODUCED IN EXAMPLE 1
(b) STEM-BF IMAGE      (c) STEM-HAADF IMAGE

[Figure 3]
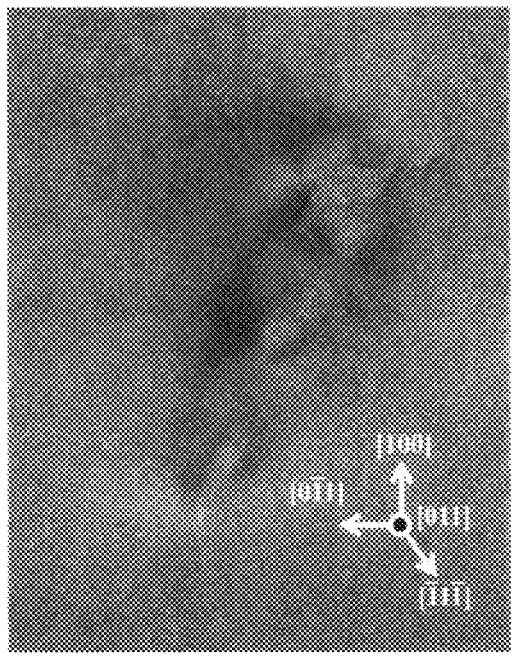
SINGLE CRYSTAL SILICON PRODUCED IN COMPARATIVE EXAMPLE 1
(a) TEM IMAGE
[Figure 4]
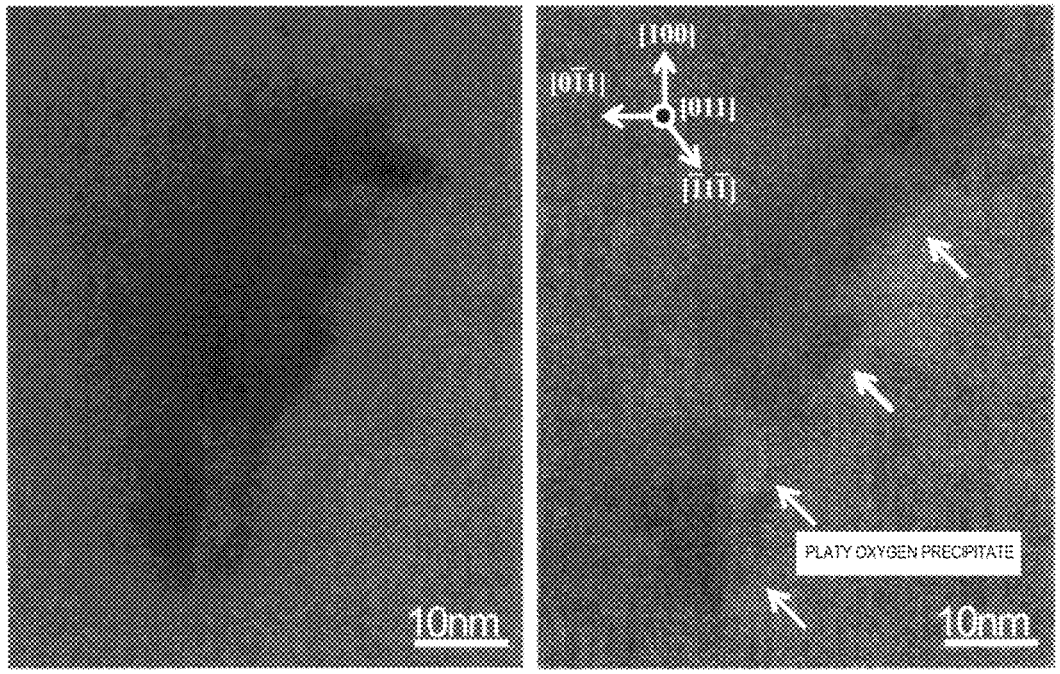
SINGLE CRYSTAL SILICON PRODUCED IN COMPARATIVE EXAMPLE 1
(b) STEM-BF IMAGE  (c) STEM-HAADF IMAGE

[Figure 5]
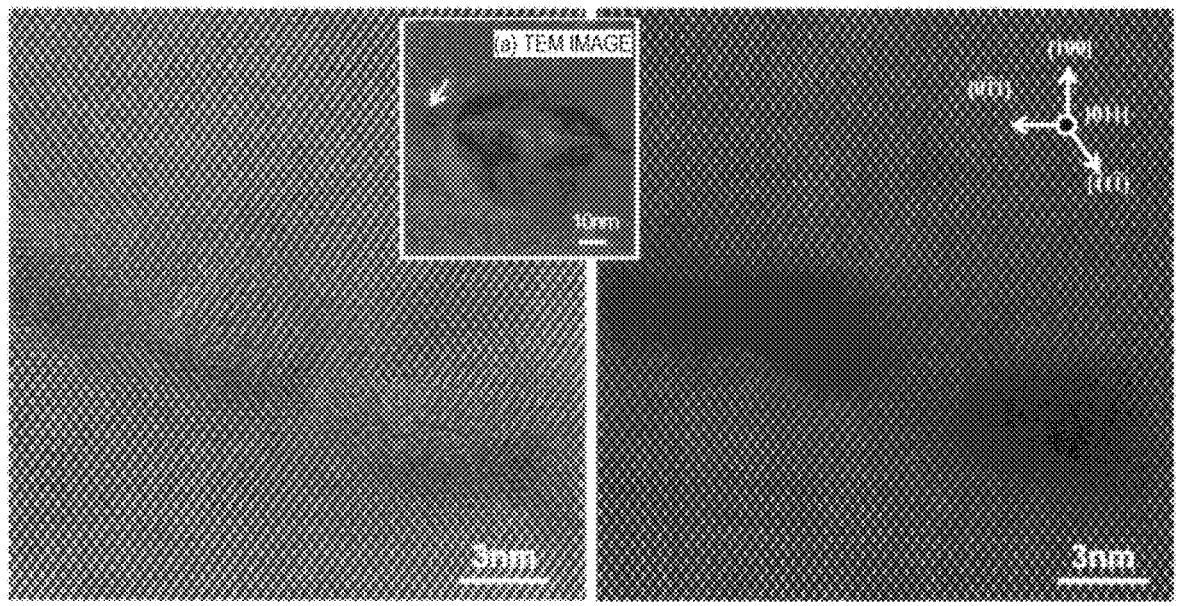
SINGLE CRYSTAL SILICON PRODUCED IN EXAMPLE 1
(b) STEM-BF IMAGE      (c) STEM-HAADF IMAGE
[Figure 6]
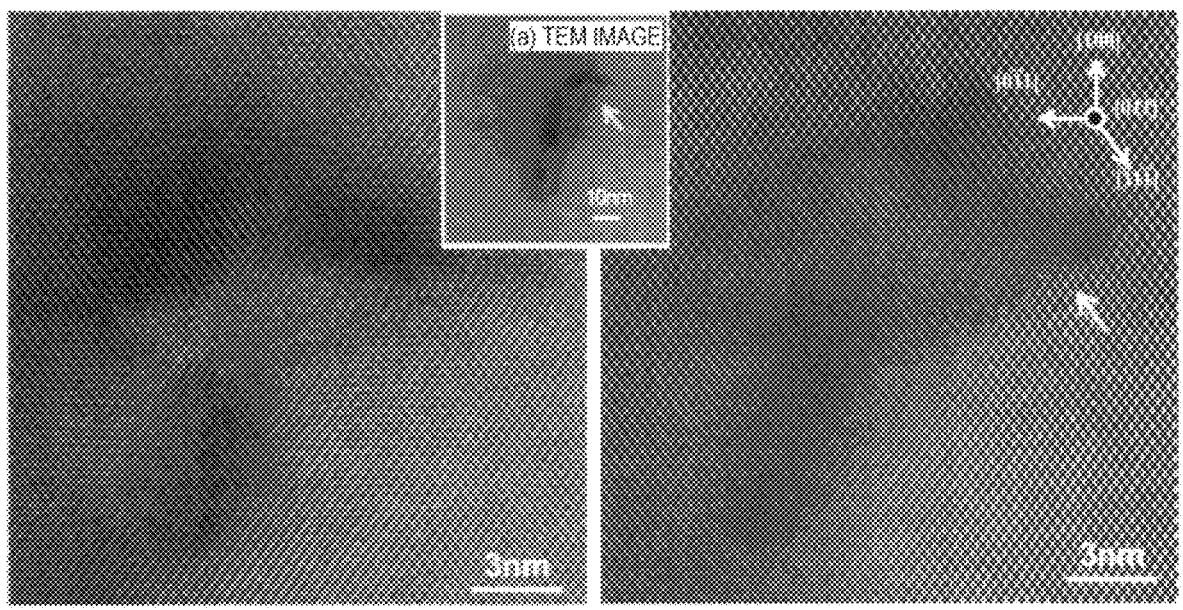
SINGLE CRYSTAL SILICON PRODUCED IN COMPARATIVE EXAMPLE 1
(b) STEM-BF IMAGE      (c) STEM-HAADF IMAGE

[Figure 7]
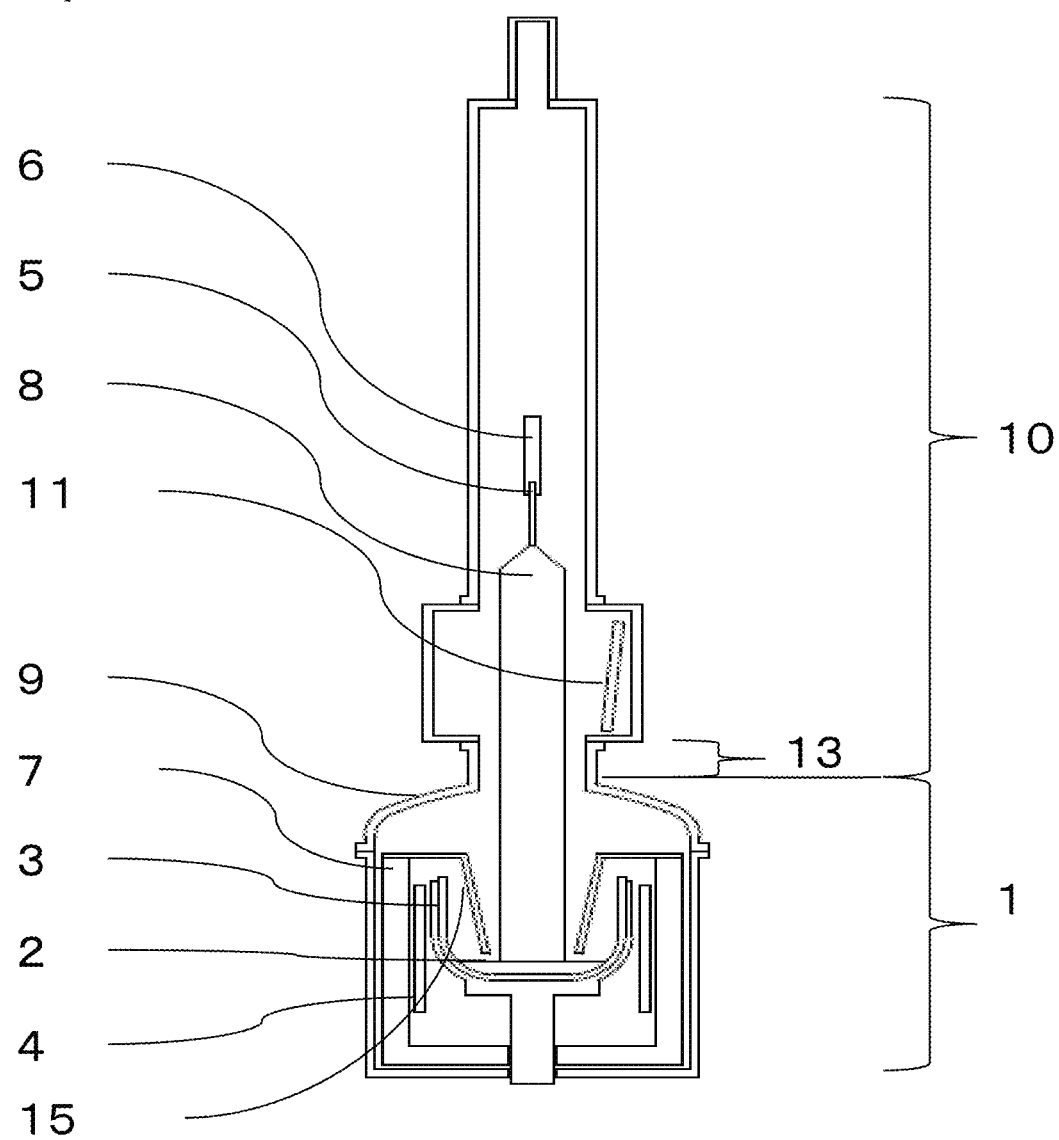

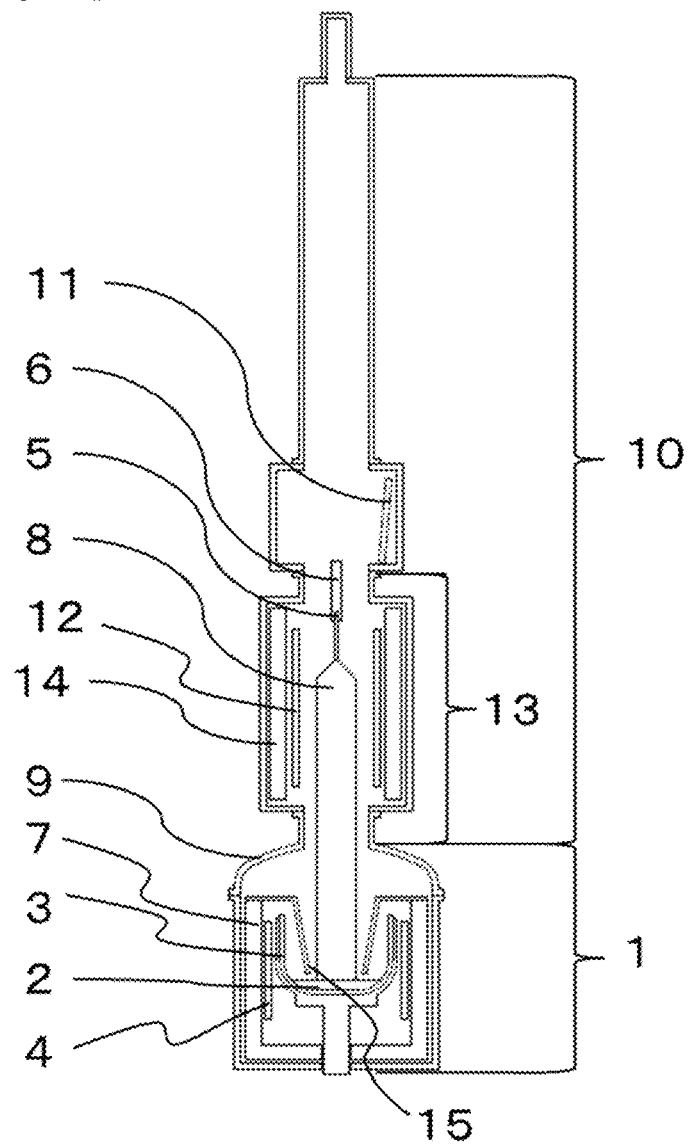
[Figure 8]

SINGLE CRYSTAL SILICON PLATE-SHAPED BODY

This application is a U.S. national stage application of PCT/JP2017/024235 filed on 30 Jun. 2017 and claims priority to Japanese patent document 2016-134375 filed on 6 Jul. 2016, the entireties of which are incorporated herein by reference.

TECHNICAL FIELD

The present invention relates to a single crystal silicon plate-shaped body, particularly a single crystal silicon plate-shaped body in which precipitation nuclei growing into oxygen precipitates in a heating process of device production are controlled, and a production method by means of a Czochralski (hereinafter, CZ) method of a single crystal silicon ingot in which the single crystal silicon plate-shaped body can be quarried.

BACKGROUND OF THE INVENTION

Single crystal silicon is widely used as a substrate material of semiconductor devices for integrated circuits, power control, or the like and solar cells. As a method of producing an ingot of single crystal silicon having high purity, no dislocation, and a large diameter, a CZ method is a mainstream method.

In the production of the single crystal silicon ingot by the CZ method, solid polycrystalline silicon as a raw material is filled in a crucible made of quartz, heated to a melting point or above of silicon, and melted. Then, after a seed crystal of silicon is brought into contact with a surface of the silicon melt in the crucible, the silicon melt is coagulated below the seed crystal by a so-called pulling up method of pulling up the seed crystal slowly, and is grown into a crystal to produce single crystal silicon.

In the pulling up of such a single crystal silicon ingot, first, the seed crystal is brought into contact with the melt surface, and then the crystal is pulled up while narrowing the diameter to eliminate a dislocation occurring by thermal shock in the seed crystal (necking). Thereafter, a shoulder (enlarging diameter portion) is made by pulling up while enlarging the crystal diameter to a target diameter, and a crystal is grown in a constant diameter to pull up a straight body portion (constant diameter portion) having a target length. Thereafter, the single crystal ingot is detached from the silicon melt while making a tail (reducing diameter portion) by reducing the crystal diameter, and is pulled upward in a CZ apparatus and cooled. A substrate (wafer) for semiconductor devices or solar cells is obtained by slicing the straight body portion of the single crystal silicon ingot obtained in this way into a plate-shaped body having a target thickness.

In the CZ method, since the raw material silicon melt and an inner wall of the quartz crucible are in contact at high temperature, the inner wall surface of the quartz crucible reacts with the silicon melt and dissolves, and oxygen melts into the silicon melt. Therefore, oxygen of about 10 ppma to 50 ppma (ASTM F121-79) is taken into the pulled up single crystal silicon. The oxygen in the single crystal silicon is supersaturated in a heating treatment process performed in a production process of semiconductor devices or solar cells, precipitates in the crystal as oxygen precipitates, and forms a fine defect. In the production of semiconductor devices such as integrated circuits, since the formed oxygen precipitates effectively act as a gettering site of harmful metal impurities, the formed oxygen precipitates are called internal gettering and are widely used. On the other hand, since the oxygen precipitates are a recombination center of carriers, a minority carrier lifetime (hereinafter referred to as "lifetime") is shortened, and decreasing conversion efficiency of the solar cells and a leak defect in a power device for power control are caused.

As described above, since the oxygen forming the oxygen precipitates is derived from dissolution of the quartz crucible to the silicon melt, in so far as the quartz crucible is used for pulling up the single crystal silicon ingot, it is unavoidable to mix a substantial amount of oxygen into the single crystal. In particular, an upper portion of the ingot, that is, an upper portion of the straight body portion grown in an initial pull-up stage is pulled up when an amount of oxygen eluted from the quartz crucible is large because, at the initial pulling-up stage, an amount of silicon melt in the quartz crucible is large and a contact area between the crucible inner wall surface and the silicon melt is large.

As the pulling up of the single crystal ingot proceeds, in other words, since the silicon melt in the quartz crucible decreases while the straight body portion of the ingot grows, the contact area between the crucible inner wall surface and the silicon melt decreases, and the oxygen incorporated into the single crystal also decreases. As a result, the oxygen concentration distribution in the pull-up (vertical) direction in the single crystal silicon ingot is uneven, and a concentration of the oxygen is higher in the upper portion. Specifically, in a region of the upper portion of the ingot, an oxygen concentration between lattices in the crystal is usually 25 ppma to 45 ppma, and is about 25 ppma to 40 ppma even an incorporation amount thereof is suppressed. Therefore, an amount of the oxygen precipitates formed in the wafer sliced from the upper portion of the ingot increases, and a proportion defective of the substrate when formed into a solar cell or a power device increases.

It is known that such oxygen precipitates are easily generated when an impurity carbon in the single crystal silicon act as a precipitation nucleus, and as a concentration of substitutional carbon increases, number density of the oxygen precipitates rises. Usually, in the upper portion of the ingot, the substitutional carbon concentration is about 0.001 ppma to 1 ppma, and a lower one of 0.5 ppma or less is preferable in view of reducing the oxygen precipitates.

Furthermore, it is known that a morphology of the oxygen precipitates is influenced and changed by thermal history during pulling up and cooling of the single crystal in a CZ method ingot pulling up device in the production process of the single crystal ingot. By controlling cooling conditions of the single crystal ingot in the pulling up device considering this knowledge, it is possible to reduce the amount of the oxygen precipitates formed when the single crystal ingot is removed from the pulling up device (as-grown). In particular, since a temperature range of 700° C. to 600° C. during cooling of the single crystal ingot in the pulling up device affects the formation of the oxygen precipitates, it is effective to rapidly cool this temperature range to shorten staying time as much as possible. As described above, since the oxygen concentration in the single crystal is higher in the upper portion of the ingot and the oxygen precipitates are easily formed, an effect of the rapid cooling is particularly high in the upper portion of the ingot.

In order to realize such specific temperature history, in an upper space in a main chamber of a device which pulls up the single crystal silicon ingot, a heat insulating material or a temperature control device are provided so as to surrounding the pulled-up ingot to enable precise temperature control (see Patent Literatures 1, 2, and the like). When the heat insulating material or the temperature control device is provided in the upper space in the main chamber of the pulling up device in this way, cooling of the single crystal silicon ingot during crystal growth can be precisely performed until the upper portion of the ingot reaches the upper space of the main chamber, and slow cooling of the ingot from the initial growth stage to 700° C. can be well performed. After the growth of the ingot is completed, that is, after a growth interface between the single crystal ingot and the silicon melt is detached, the entire ingot is pulled up into a pull chamber above the CZ device and cooled, so that rapid cooling in a temperature range of 700° C. to 600° C. can be efficiently performed.

A substrate obtained by slicing the single crystal silicon ingot pulled by the CZ method into a plate-shaped body is used as a substrate for devices such as various semiconductors and solar cells. However, oxygen precipitation may be generated due to thermal history of the device production process or heat treatment corresponding thereto, and lifetime of the substrate may decrease. In general, it is known that when a single crystal silicon substrate is heat treated, a shape of the oxygen precipitates formed and grown in a crystal is a thin plate.

That is, when heat treated at a high temperature higher than 1100° C. for a long time, oxygen precipitates having a large polyhedral structure of several 100 nm grows, but the oxygen precipitates grow into a thin plate shape at a lower temperature. Thus, the oxygen precipitates having a polyhedral structure have a small distortion exerting on surroundings thereof, and a few dislocations generating from the oxygen precipitates occur. Therefore, even if the oxygen precipitates having a polyhedral structure is formed, decrease in lifetime of the single crystal silicon is difficult to occur. On the other hand, since a strong compression stress is generated on an interface between the thin plate-shaped oxygen precipitates and a surrounding silicon crystal mother phase, a distortion field is large and it is easy to induce a dislocation. In particular, in the vicinity of 1000° C., the plate-shaped oxygen precipitates is easily generated, and a dislocation often occurs. Regarding number density of oxygen precipitates to be formed, it is known that number density of polyhedral oxygen precipitates is low and number density of the plate-shaped oxygen precipitates is very high (see, for example, Non Patent Literature 1).

According to Patent Literatures 3 and 4, the single crystal silicon substrate is heat treated at a temperature of about 800° C. for several hours and then heat treated further for several hours at a temperature of 1000° C. or above, so that a single crystal silicon substrate having polyhedral oxygen precipitates and a few dislocations can be obtained. After nuclei of the plate-shaped oxygen precipitates formed in the crystal disappear by the treatment for several hours at about 800° C., since the substrate is further subjected to a specific heating operation of treatment for several hours under high temperature conditions of 1000° C. or higher, the oxygen precipitates grow into the polyhedral structure. However, also in the substrate used in these examples, the plate-shaped oxygen precipitates grow by heating treatment at a relatively low temperature such as various production processes (dopant diffusion, thermal oxidation, or the like) of the solar cell and the power device. As a result, after the heating treatment under such low temperature conditions, a lifetime of the substrate decreased, and satisfactory properties were not obtained.

CITATION LIST

Patent Literature

Patent Literature 1: Japanese Patent No. 3006669
Patent Literature 2: Japanese Patent Laid-Open No. H11-92274
Patent Literature 3: Japanese Patent Laid-Open No. H9-190954
Patent Literature 4: Japanese Patent Laid-Open No. 2011-228459

Non Patent Literature

Non Patent Literature 1: Shisei Shimura, "Silicon Crystal Engineering", Maruzen, 1993, p 294

SUMMARY OF INVENTION

Technical Problem

According to the method of rapidly cooling a temperature range of 700° C. to 600° C. during cooling of the single crystal silicon ingot in the pulling up device as in the Patent Literatures 1 and 2, it is possible to considerably reduce formation of the oxygen precipitates in the upper portion of the straight body portion. As a result, an as-grown state, that is, the single crystal ingot is taken out from the pulling up device, and the heating treatment is not performed thereafter, the lifetime can be greatly improved.

However, even the substrate obtained from these single crystal silicon ingots, when subjected to a heating treatment process such as dopant diffusion or thermal oxidation (usually 800° C. to 1100° C.) in a device production process of a solar cell, a power device, or the like, oxygen is precipitated, and decrease in lifetime is observed. In particular, since the upper portion of the straight body portion of the ingot is a region having a high oxygen concentration as described above, oxygen precipitation becomes severe on the substrate cut off from this region. As a result, the lifetime decreases remarkably, device performance greatly deteriorates, and a non-defective product rate of the silicon substrate, that is, a yield of a substrate product from the straight body portion of the single crystal silicon ingot deteriorates, which is a big problem.

In the as-grown state, the oxygen precipitates cannot be observed even when the inside of the crystal in the upper portion of the straight body portion of the single crystal silicon ingot is observed with a transmission electron microscope. However, when the substrate subjected to heating treatment in the device production process or a test piece subjected to the same heating treatment is observed under a transmission electron microscope, a great number of thin plate-shaped oxygen precipitates are observed. Even in the single crystal silicon ingot obtained by rapidly cooling the temperature range of 700° C. to 600° C., although some decrease in the number density is recognized, formation of many plate-shaped oxygen precipitates is observed.

Therefore, even if the temperature range of 700° C. to 600° C. is rapidly cooled, very small oxygen precipitates or oxygen precipitation nuclei which cannot be observed with the transmission electron microscope are generated in a bulk (in the crystal), and these are considered to grow into plate-shaped oxygen precipitates having a size that can be observed with the transmission electron microscope. As a result, it can be inferred that the lifetime of the substrate decreases and respective device performance decreases. In particular, when a substitutional carbon concentration is high at 0.01 ppma or more in the upper portion of the straight body portion of the ingot, the formation of the plate-shaped oxygen precipitates increases as the substitutional carbon concentration increases, and a problem of deterioration of the device performance due to the decrease in the lifetime of such a substrate has occurred more remarkably.

Further, when these plate-shaped oxygen precipitates are observed with a clear lattice image of a silicon crystal at a high magnification of, for example, 5,000,000 times or more, a dislocation or a distortion of the crystal lattice is observed in surroundings of the oxygen precipitates. Since the amount of distortion to be applied to the surroundings increases when the plate-shaped oxygen precipitates grow, the dislocation easily occurs. Then, dangling bonds are made to the dislocation occurring due to the plate-shaped oxygen precipitates, which serve as recombination centers of minority carriers, and become defects that reduce the lifetime.

From the above, it has been a major challenge to develop single crystal silicon where even if heating treatment (800° C. to 1100° C.) in the device production process is applied to a single crystal silicon plate-shaped body having a high oxygen concentration obtained from the upper portion of the straight body portion of the ingot, decrease in lifetime is suppressed, and a high-performance substrate is obtained as a solar cell or a power device.

Solution to Problem

The present inventors have continued intensive studies in view of the above problem. As a result, the present inventors have that the above problems are effectively resolved if single crystal silicon plate-shaped body, in which a shape of the grown oxygen precipitates is a polyhedral structure after going through thermal history equivalent to heating treatment in a device production process, is quarried from a CZ method single crystal silicon ingot.

That is, the present invention relates to a single crystal silicon plate-shaped body in which an interstitial oxygen concentration in a crystal is 25 ppma to 45 ppma and a substitutional carbon concentration is 0.5 ppma or less in a radial center, and in the radial center, oxygen precipitates are not observed in a bulk in an image of 200,000 times by means of a transmission electron microscope, and after heating the single crystal silicon plate-shaped body at 950° C. for 60 minutes, oxygen precipitates are observed in an image of the 200,000 times, and a shape of the oxygen precipitates is observed in a polyhedral structure in an image of 2,000,000 times.

In the above single crystal silicon, the substitutional carbon concentration is preferably 0.001 ppma to 0.3 ppma.

In the above single crystal silicon plate-shaped body, number density of oxygen precipitates to be observed after heating is preferably $1 \times 10^{13}$ pieces/cm$^3$ or less.

The single crystal silicon plate-shaped body is preferably quarried from a CZ method single crystal silicon ingot and is not subjected to thermal history at 900° C. or higher after quarrying. Here, the single crystal silicon ingot is more preferably quarried from an upper portion of a straight body portion of the CZ method single crystal silicon ingot.

Further, the present invention also provides a CZ method single crystal silicon ingot comprising a region that satisfies properties of the characteristic single crystal silicon plate-shaped body in the ingot long-axis direction. Here, in the CZ method single crystal silicon ingot, the region satisfying the properties of the characteristic single crystal silicon plate-shaped body is preferably included in the upper portion of the straight body portion.

Further, the present invention also provides a method for producing a CZ method single crystal silicon ingot, in which when a single crystal silicon ingot is pulled up by a CZ method from a melt in which polycrystalline silicon is melted, a region where an interstitial oxygen concentration is 25 ppma to 45 ppma and a substitutional carbon concentration is 0.5 ppma or less in a radial center in a long axis direction of the ingot is cooled from 1000° C. to 800° C. in a cooling time of 10 hours or more.

Further, the present invention also provides a method of producing a single crystal silicon plate-shaped body, in which a single crystal silicon is quarried into a plate shape from a long axis direction region in which an interstitial oxygen concentration is 25 ppma to 45 ppma and a substitutional carbon concentration is 0.5 ppma or less in the radial center after the CZ method single crystal silicon ingot is produced by the above method.

The present invention is made based on knowledge that when a substrate quarried from the CZ method single crystal silicon ingot is subjected to heat treatment in a device production process, influence on lifetime of the substrate and performance of a produced device is different according to the shape of the oxygen precipitates formed in the substrate, and if the shape of the oxygen precipitates is a polyhedral structure, decrease in lifetime is small, and the substrate has excellent characteristics as a substrate for a device such as a solar cell or a power device.

That is, although containing interstitial oxygen in the crystal at a high concentration of 25 ppma to 45 ppma, the single crystal silicon plate-shaped body of the present invention has a remarkable characteristic feature that the oxygen precipitates to be precipitated has a polyhedral structure even if heating treatment which simulates processing in a device manufacture process at 950° C. for 60 minutes is applied. In a case of a conventional single crystal silicon substrate, in heat treatment in the device production process described above, the oxygen precipitates generally grow into a thin plate shape. Such behavior of forming the oxygen precipitates having a polyhedral structure at 950° C., which is a typical temperature in a processing temperature range thereof, is extremely specific. Although the single crystal silicon plate-shaped body of the present invention has a high oxygen concentration as quarried from the upper portion of the ingot straight body portion from this characteristic, a decrease in lifetime is small and yield of a non-defective substrate is excellent.

Further, solar cell characteristics (conversion efficiency) are higher than the conventional single crystal silicon in which the substitutional carbon concentration is in a same degree as that of the present invention. The high solar cell characteristics are more prominent as the substitutional carbon concentration is lower. Further, an open-circuit voltage of the solar cell and lifetime of the substrate after the solar cell device is formed are excellent in the same tendency.

BRIEF DESCRIPTION OF THE DRAWINGS

FIG. 1 is an observation image by means of a transmission electron microscope of oxygen precipitates after heating treatment at a temperature of 950° C. for 60 minutes of single crystal silicon produced in Example 1. FIG. 1 is (a) a TEM image at an observation magnification of 2,000,000 times.

FIG. 2 is (b) a scanning transmission electron microscope-bright field image (STEM-BF image) of 2,000,000 times and (c) a scanning transmission electron microscope-high angle annular dark field image (STEM-HAADF image) of the oxygen precipitates of Example 1 shown in FIG. 1.

FIG. 3 is an observation image by means of a transmission electron microscope of oxygen precipitates after heating treatment at a temperature of 950° C. for 60 minutes of single crystal silicon produced in Comparative Example 1. FIG. 3 is (a) a TEM image at an observation magnification of 2,000,000 times.

FIG. 4 is (b) a scanning transmission electron microscope-bright field image (STEM-BF image) of 2,000,000 times and (c) a scanning transmission electron microscope-high angle annular dark field image (STEM-HAADF image) of the oxygen precipitates of Comparative Example 1 shown in FIG. 3.

FIG. 5 is (b) a STEM-BF image and (c) a STEM-HAADF image at 8,000,000 times of the oxygen precipitates of Example 1 shown in FIG. 1. In addition, (a) is a TEM image showing the observation position.

FIG. 6 is (b) a STEM-BF image and (c) a STEM-HAADF image at 8,000,000 times of the oxygen precipitates of Comparative Example 1 shown in FIG. 3. In addition, (a) is a TEM image showing the observation position.

FIG. 7 is a schematic view of a single crystal silicon ingot pulling up device according to a general CZ method.

FIG. 8 is a schematic view showing a preferable aspect of the single crystal silicon ingot pulling up device of the present invention.

DETAILED DESCRIPTION OF INVENTION

The single crystal silicon plate-shaped body of the present invention is formed in a plate shape comprising a silicon crystal in which directions of atom arrangements throughout crystals are uniform. An interstitial oxygen concentration in the crystal is in a high range as described later, and the single crystal silicon plate-shaped body generally quarried from a silicon single crystal ingot produced by pulling up and coagulating or cooling from molten silicon by a CZ method, in particular those quarried from an upper portion of a straight body portion of the silicon single crystal ingot. The plate-shaped body generally has a circular plate shape, but may be molded into a desired shape such as a rectangular plate.

The silicon single crystal ingot produced by the CZ method is generally composed of a long cylindrical straight body portion (constant diameter portion), and a shoulder portion (enlarging diameter portion) and a tail portion (reducing diameter portion) located at both ends of the ingot in a state immediately after the pulling up. The length of the straight body portion is not particularly limited, but is preferably 600 mm to 2500 mm, and more preferably 1100 mm to 2500 mm in view of improving productivity.

The diameter of the straight body portion is also not particularly limited, but is preferably 100 mm to 300 mm, and more preferably 150 mm to 250 mm. Therefore, if the plate-shaped body is quarried from the straight body portion, the diameter thereof is also in this dimension. The thickness of the plate-shaped body is suitably 0.1 mm to 1 mm in consideration of the substrate use of the solar cell or the power device.

On the single crystal silicon, a conductivity type may be n type or p type, but the n type is preferable for reasons such as being easy to obtain single crystal silicon excellent in lifetime. As impurities to be doped, for example, phosphorus (P), arsenic (As), and antimony (Sb) are exemplified as a n-type dopant, and boron (B), aluminum (Al), gallium (Ga), indium (In), and the like can be used as a p-type dopant without any limits.

As described above, the single crystal silicon plate-shaped body of the present invention is defined by characteristic features of the interstitial oxygen concentration and a substitutional carbon concentration in the crystal, and unique behavior of the oxygen precipitates observed with a transmission electron microscope. These properties are evaluated at the center of the plate-shaped body in the radial direction. This is because, as described above, in the CZ method silicon single crystal ingot, the oxygen concentration is particularly high on the upper portion of the straight body portion in a long axis direction of the ingot, but a concentration of oxygen dissolved out from a quartz crucible becomes higher at the center of the plate-shaped body in the vicinity of a growth interface of the crystal by convection of the silicon melt in the quartz crucible when viewed in the radial direction.

Since oxygen in the silicon melt is taken into the crystal from the growth interface with the growth of the ingot, the oxygen concentration of the ingot is the highest at the central having the highest concentration in the melt, and is the lowest at the peripheral portion. That is, a problem of deterioration in the device performance due to formation of oxygen precipitates in the single crystal silicon substrate is particularly remarkable at the center when viewed in the radial direction, and thus improvement of this problem is evaluated at the radial center.

In the present invention, the radial center of the single crystal silicon plate-shaped body is a position within 20% in the radial direction from the center. For example, in a case of a circular plate shape having a radius of 100 mm (a diameter of 200 mm), the improvement is evaluated in a circle having a radius of 20 mm from the center. In a case of the rectangular shape, a circumscribed circle is assumed and evaluated from the center of gravity of the rectangular shape in a circle having a radius of 20% of a radius of the circumscribed circle. When the properties are measured within this range, results are obtained in substantially the same value or the same state.

The single crystal silicon plate-shaped body of the present invention has an interstitial oxygen concentration of 25 ppma to 45 ppma in the crystal at the radial center. Further, the interstitial oxygen concentration is preferably 30 ppma to 43 ppma. Here, the interstitial oxygen concentration in the crystal refers to a value measured by Fourier transform infrared spectroscopy and derived with ASTM F121-79.

As described above, since incorporation of oxygen into the single crystal is large at an initial stage of pulling up of the CZ method silicon single crystal ingot, a region satisfying the interstitial oxygen concentration features defined in the present invention is easily included in the upper portion of the straight body portion (specifically, a range from the upper end of the straight body portion to 50 mm downward).

That is, since the upper portion of the straight body portion of the ingot has a high oxygen concentration, in the substrate quarried from this portion, plate-shaped oxygen precipitates are formed by heating treatment in a device production process, and a lifetime decreases. Therefore, if the single crystal silicon of this portion satisfies the properties of the present invention, it is possible to greatly improve an acquisition yield of fair-quality substrates in the plate-shaped body quarried from the ingot, and is particularly effective.

The single crystal silicon plate-shaped body of the present invention is required to have a substitutional carbon concentration at the radial center of 0.5 ppma or less, preferably 0.001 ppma to 0.3 ppma, particularly preferably 0.01 ppma to 0.3 ppma in addition that the interstitial oxygen concentration at the radial center is in the above range. Here, the substitutional carbon means carbon in a state in which silicon atoms located at lattice positions of the silicon crystal are substituted with carbon.

As described above, since impurity carbon in the single crystal silicon becomes a nucleus of oxygen precipitates when heating treated, it is necessary to lower the substitutional carbon concentration to the above range. Here, when the substitutional carbon concentration exceeds 0.5 ppma, it is not preferable that formation of oxygen precipitation nuclei by the carbon impurities becomes dominant, the shape of the oxygen precipitates becomes unstable, the number density also rises, and the lifetime of the substrate decreases. The substitutional carbon concentration can be reduced, for example, by using a high-purity raw material (polycrystalline silicon). The substitutional carbon concentration can be controlled by means of selecting material of a heating treatment furnace to reduce contamination of carbon, or adjusting an exhaust gas flow.

In the present invention, the substitutional carbon concentration of single crystal silicon refers to a value measured by Fourier transform infrared spectroscopy and derived with ASTM F123-86. A test piece used for measuring the substitutional carbon concentration may be the same test piece used for measuring the interstitial oxygen concentration, and the substitutional carbon concentration may be measured by the same infrared absorption spectrum.

The measurement of the substitutional carbon concentration by the Fourier transform infrared spectroscopy usually has a measurement lower limit of about 0.04 ppma, and when the substitutional carbon concentration is lower than the lower limit, sufficient measurement accuracy cannot be obtained. In turn, in the silicon single crystal ingot, the substitutional carbon concentration of the straight body portion is lowest at the upper portion thereof. With proceeding the pulling up of the ingot, carbon is concentrated in the silicon melt in the crucible, and hence the lower portion has a higher carbon concentration. Then, even when the upper portion of the straight body portion has the lowest substitutional carbon concentration lower than the lower limit of measurement by the Fourier transform infrared spectroscopy, when the substitutional carbon concentration is higher than the lower limit of measurement in a middle portion or a lower portion, measurement samples are acquired from the middle portion and the lower portion, and carbon concentrations are measured, the substitutional carbon concentration at the upper portion of the straight body portion may be determined by calculation based on a segregation coefficient (0.07) of carbon in silicon considering a solidification rate determined by a ratio of a crystal weight at the measurement sample acquisition position to a weight of polycrystalline silicon raw material filled in the crucible. That is, the substitutional carbon concentration in the upper portion of the ingot can also be calculated by measuring and extrapolating the substitutional carbon concentration in the middle portion or the lower portion of the ingot from the solidification rate and the segregation coefficient of carbon.

After the ingot is produced by the CZ method or the like, the single crystal silicon plate-shaped body of the present invention is not subjected to a temperature at which the oxygen precipitates grow actively, specifically thermal history at 900° C. or higher, or even if subjected, the single crystal silicon plate-shaped body is only exposed for a short time such that the oxygen precipitates do not grow substantially. Therefore, in the radial center, oxygen precipitates are not observed in a bulk in an image of 200,000 times by the transmission electron microscope while the interstitial oxygen concentration and the substitutional carbon concentration are in the above ranges. Then, by heating at 950° C. for 60 minutes, oxygen precipitates having a polyhedral structure is appeared in the bulk by image observation with the transmission electron microscope.

Here, the oxygen precipitates having a polyhedral structure is usually an octahedron to a tetrakaidecahedron that is surrounded by a {111} plane and a {100} plane of Si, and is most often an octahedron. The polyhedral structure is not necessarily a regular polyhedron, and may be distorted or flat. The size (major axis) is 5 nm or more, which can be visually recognized by image observation at the 2,000,000 times, but is usually 10 nm to 200 nm, more preferably 20 nm to 100 nm, particularly preferably 25 nm to 75 nm, as long size. On the other hand, the plate-shaped oxygen precipitates are flat and can be regarded as a distorted hexahedron. The size (major axis) is about 20 nm at a maximum.

A reason why oxygen precipitates having a polyhedral structure is precipitated by heating treatment at 950° C. for 60 minutes in the single crystal silicon plate-shaped body of the present invention is not necessarily certain. Since a state of the oxygen precipitates growing by applying the same heating treatment is completely different from that of the conventional single crystal silicon substrate, it is considered to be related to the structural difference of the oxygen precipitation nuclei generated in a process of cooling the ingot in the pulling up device, in other words, already existing in the as-grown crystal before the heating treatment.

However, the oxygen precipitation nuclei which may present in the as-grown single crystal silicon are very small and cannot be detected by using a high-resolution transmission electron microscope or other analysis methods as now available, and a detailed structure thereof is not clear. A difference in the oxygen precipitation nuclei is expressed only by first applying the heating treatment and growing into larger oxygen precipitates.

Although a generation mechanism of the oxygen precipitation nuclei in the cooling process of the ingot is not clear yet, it is considered that the nuclei growing into the plate-shaped oxygen precipitates are generated in a relatively low temperature range of less than 800° C. during cooling of the ingot in the pulling up device. The nuclei growing into the oxygen precipitates having the polyhedral structure present in the single crystal silicon ingot of the present invention are considered to be generated in a high temperature range of 800° C. or higher.

When the single crystal silicon is observed at a high magnification of 5,000,000 times or more, a lattice image of the silicon crystal can be clearly observed. According to the observation at such a high magnification, it can be confirmed that the oxygen precipitates having the polyhedral structure are usually small in a dislocation originating from the oxygen precipitates, and crystal lattice distortion is small. On the other hand, in a case of conventional single crystal silicon in which plate-shaped oxygen precipitates grow by the above heating treatment, the crystal lattice distortion is large, and a lot of dislocations starting from the oxygen precipitates are observed.

When the plate-shaped oxygen precipitates grow, a large amount of distortion is given to surroundings thereof to make the dislocations occur, whereas in the oxygen precipitates having the polyhedral structure found in the single crystal silicon plate-shaped body of the present invention, distortion given to the surroundings when the plate-shaped oxygen precipitates grow is small, and the dislocations are hard to occur. Therefore, it is inferred that formation of dangling bonds serving as recombination centers of minority carriers is suppressed, and decrease in lifetime is suppressed.

When the single crystal silicon plate-shaped body of the present invention is heated at 950° C. for 60 minutes, the polyhedral structure as oxygen precipitates is formed, and hence, the distortion of the crystal lattice thereof is small, and occurrence of the dislocation is also suppressed. Further, the number of presence of the oxygen precipitates easily tends to be small. In detail, the volume of the one oxygen precipitate having a polyhedral structure is much larger than that of plate-shaped thin oxygen precipitate. Therefore, when the same degree of solute oxygen is precipitated by heating treatment, the number density decreases in a case where the solute oxygen is formed into a polyhedral structure in such a manner. Thus, low number density of the oxygen precipitates formed by heating treatment is one of characteristics of the single crystal silicon of the present invention.

Specifically, the number density of the oxygen precipitates can be $1\times10^{13}$ pieces/cm$^3$ or less, particularly preferably $2\times10^{12}$ pieces/cm$^3$ or less. Since the number density of the oxygen precipitates is very small as described above, decrease in lifetime is further reduced. The lower limit of the number density of the oxygen precipitates is not particularly limited, but the lower limit of the number density of oxygen precipitates is about $1\times10^{11}$ pieces/cm$^3$ in view of industrial reproducibility.

There is also a way of thinking that the decrease in lifetime accompanying with growth of the oxygen precipitates is caused by a dangling bond generated at the interface between the oxygen precipitates and the silicon crystal of a mother phase in addition to the above dislocation occurrence. From this, with regard to the shape of the oxygen precipitates, it is advantageous to reduce a surface area, that is, an area of the interface with the mother phase silicon, and if the number density is low, the total area of the interface is further reduced. Therefore, as comparing with a case where the plate-shaped oxygen precipitates are formed with a case where the oxygen precipitates having a relatively large polyhedral structure is formed, it can be inferred that the total area of the interface becomes particularly small in the latter case, and the lifetime is improved.

In the single crystal silicon plate-shaped body of the present invention, the oxygen precipitates observed when heated at 950° C. for 60 minutes may also contain plate-shaped oxygen precipitates as far as the oxygen precipitates having the polyhedral structure are present. Originally, all of the oxygen precipitates are formed as plate-shaped structure, but if a part thereof is formed as a polyhedral structure, the distortion of the crystal lattice becomes small and the dislocation is also suppressed by that difference.

The reason why a part of the oxygen precipitates formed by heating at 950° C. for 60 minutes becomes plate-shaped structure is considered that oxygen precipitation nuclei growing into plate-shaped oxygen precipitates generate at the end of the production process of the CZ method single crystal silicon ingot when the ingot passes through a low-temperature region of less than 800° C. in the pulling up device. The plate-shaped oxygen precipitates having lower number density is preferable because an influence on a lifetime after heating treatment and a decrease in the solar cell performance is small and an influence on the yield of the fair-quality substrate is also reduced. Among the observed oxygen precipitates, 10% or more is preferably a polyhedral structure based on a number criterion, and more preferably 75% or more.

A method of observing a morphology of oxygen precipitates in the bulk of the single crystal silicon plate-shaped body by a transmission electron microscope is as follows. That is, two sample substrates are sliced from nearby positions, one is used for observation without heating treatment, and the other is used for observation after applying heating treatment. After the latter sample substrate is subjected to heating treatment at 950° C. for 60 minutes, an ultrathin section sample is produced by a well-known method from the radial center of each sample substrate, and a morphology of oxygen precipitates in the bulk is observed by a transmission electron microscope. Here, a quarrying position of the sample substrate is a portion close to a position where the measurement sample for the interstitial oxygen concentration and substitutional carbon concentration is quarried, in the long axis direction of the ingot. In a preferable aspect, an actual device substrate is sliced and used as the sample substrate.

Since a damaged layer by cutting and slicing is formed on the surface of the sample substrate, the damaged layer needs to be removed by grinding or acid etching before the heating treatment because the damaged layer affects a state of oxygen precipitation generated in the heating treatment. Usually, the damaged layer is preferably removed by etching of a mixed acid of hydrofluoric acid/nitric acid and the like. Although the depth of the damaged layer is different due to a state of cutting or slicing, it is possible to confirm that the damaged layer is removed by visually confirming that the etched surface is a mirror surface.

Immediately before the heating treatment, the sample substrate is preferably subjected to acid washing to remove surface contamination. A cleaning method is not particularly limited, but cleaning can be performed by a known method such as acid washing or SC1 washing. Usually, washing with a mixed acid of hydrofluoric acid/nitric acid is preferable.

In the present invention, a heating furnace used in the heating treatment of the sample substrate is not particularly limited as long as temperature control and atmosphere control are possible and thermal uniformity and cleanliness can be ensured, and various heating treatment furnaces can be used. The atmosphere of the heating treatment is an argon gas stream using argon gas having no reactivity with the single crystal silicon.

Further, when the device substrate is used as a sample substrate, it is also a preferable aspect to perform predetermined heating treatment in a processing apparatus of actual device production. Further, in the actual device production, it is also a preferable aspect in which the substrate after undergoing the dopant diffusion treatment, the thermal oxidation treatment, or the like corresponding to the heating treatment at 950° C. for 60 minutes is extracted from the step, and the substrate is used as the sample substrate.

An ultrathin section sample for observation of a transmission electron microscope is quarried from the radial center of unheated and heated sample substrates obtained therefrom, and in each case, a morphology of the oxygen precipitates is observed in an image of 200,000 times, and a shape thereof is observed in an image of 2,000,000 times. The ultrathin section sample can be processed by ion milling.

Since the oxygen precipitates in the ultrathin section sample is very small, it is necessary to process the thickness thereof thin, and the thickness is about 30 nm. The thickness of the ultrathin section sample may be judged by an equal thickness interference fringe when observed with a transmission electron microscope.

The ultrathin section sample is quarried at crystal orientation in which the shape of the oxygen precipitates is easily observed, that is, an observation surface of the ultrathin section is a (110) surface, namely, an incident direction of an electron beam is to be a <110> direction. Further, processing is easy when the ultrathin section is quarried such that the electron beam is incident in <110> direction perpendicular to the pulling up direction of the single crystal silicon ingot, that is, the electron beam is incident in <110> direction parallel to the substrate surface.

Although a transmission electron microscope and a scanning transmission electron microscope can be used to observe the oxygen precipitates of the present invention, in order to observe the shape of minute oxygen precipitates and a state of the distortion and dislocation occurring around the oxygen precipitates in more details, a high-resolution electron microscope is preferably used, and a transmission electron microscope and a scanning transmission electron microscope having a spherical aberration correction function (Cs collector) are preferably used. Further, as detailed in the following Examples, it is a more preferable aspect to observe using a scanning transmission electron microscope with a double Cs collector equipped with both a Cs collector for a transmission electron microscope and a Cs collector for a scanning transmission electron microscope.

In observation with a transmission electron microscope, first, at a low magnification of 20,000 times, a total of 10 visual fields, that is, a range of about 9 μm×9 μm×10 visual fields is observed by changing visual fields in the ultrathin section sample, and a minute dark shadow (black dot) observed in the ultrathin section sample is searched. Next, by increasing the magnification up to 200,000 times by focusing on the shadow, it is confirmed whether the shadow is a shadow generated due to the distortion accompanying with the oxygen precipitates which will be described later. From all distortions present in the range of about 9 μm×9 μm×10 visual fields, randomly selected 20 distortions (when less than this, all distortions) are observed at 200,000 times, and it is evaluated that oxygen precipitates are observed if there is one distortion accompanying with the oxygen precipitates. The black dot generated by the distortion accompanying with the oxygen precipitates can be confirmed by an atomic number contrast shown in a STEM-HAADF image which will be described later. The oxygen precipitates have a composition lighter than that of silicon, which is a mother phase, and is distinguished from the black dot generated by a distortion that is not accompanied by oxygen precipitates.

When the oxygen precipitates are confirmed, an observation magnification is gradually increased to 2,000,000 times while focusing on this, and the shape and size of the oxygen precipitates are measured. When 10 of them (when less than 10, all oxygen precipitates) are observed and even one of them has a polyhedral structure, it is evaluated that oxygen precipitates having polyhedral structure are formed. In addition, the size of the oxygen precipitates having a polyhedral structure is determined as an average value of major axes of the 10 polyhedral structures observed (when less than 10, all of them).

In a method of measuring the number density of oxygen precipitates, a TEM image of 10,000 to 50,000 times by a transmission electron microscope may be used, and therefore a general transmission electron microscope device can be used. As described above, the transmission electron microscope image (TEM image) shows a distortion derived from the oxygen precipitates strongly, and at a magnification of 10,000 to 50,000 times, the distortion is observed as a black dot regardless of the shape of the oxygen precipitates. The number of oxygen precipitates in the visual field of the TEM image is counted, and the number density (pieces/cm$^3$) of oxygen precipitates may be determined from the volume of observation visual fields (area of the visual field of the TEM image×the thickness of the ultrathin section sample).

In calculation of the number density of the oxygen precipitates, when substantially all distortions confirmed by observation at the above 200,000 times are oxygen precipitates, the number density of black dots measured by observation at 10,000 to 50,000 times is the number density of oxygen precipitates. In a case where not only oxygen precipitates, but defects that are not oxygen precipitates, such as voids or scratches on a sample are confirmed when the distortions are observed at 200,000 times, the number density of oxygen precipitates may be obtained by multiplying the number density of black dots by a proportion of oxygen precipitates among confirmed distortions.

In measurement of the number density of oxygen precipitates, a magnification to be observed, that is, a visual field area may be appropriately determined depending on the size and distribution state of oxygen precipitates (black dots) to be counted, but in view of obtaining reproducibility of measured values, it is necessary to set in a range of at least 500 μm$^2$ or more.

When the black dot is easily observed, if setting a large visual field at a low magnification, it is easy to determine the number density because many black dots enter in the visual field. Conversely, when the black dot is small, it is necessary to increase the observation magnification, but in this case, since the number of black dots in the visual field decreases, it is necessary to increase the number of visual fields to be observed. Also in a case of a sample having low number density of oxygen precipitates, since the number of oxygen precipitates in the visual field decreases, the number of visual fields is increased.

When the oxygen precipitates are plate-shaped, several thin oxygen precipitates are often present as a complex in one black dot. Therefore, the number density of such plate-shaped oxygen precipitates actually is higher than a value obtained as the above number of black dots. As described above, in a case of conventional single crystal silicon, the number density of oxygen precipitates determined by actual measurement is an apparent value, which is considered to be considerably lower than the number density of actually present plate-shaped oxygen precipitates. However, even in consideration of this, in oxygen precipitates having a polyhedral structure of the single crystal silicon of the present invention, it is characterized that the number density thereof is easily obtained low.

Next, a method of producing the single crystal silicon plate-shaped body of the present invention will be described. As described above, the single crystal silicon plate-shaped body of the present invention may be produced by any method in so far as each characteristic feature of the interstitial oxygen concentration, the substitutional carbon concentration in crystals, and unique behavior of the oxygen precipitates observed with the transmission electron microscope is satisfied. Usually, it is preferable to produce a single crystal silicon ingot by the following characteristic CZ method, and then by quarrying a plate-shaped body from a long axis direction region satisfying each of the interstitial oxygen concentration feature and the substitutional carbon concentration feature in the ingot.

A method of producing a single crystal silicon ingot by the CZ method is shown below.

When the single crystal silicon ingot is pulled up by the CZ method from a melt in which polycrystalline silicon is melted, the method includes a step of cooling a region where the interstitial oxygen concentration is 25 ppma to 45 ppma and the substitutional carbon concentration is 0.5 ppma or less in the radial center in the long axis direction of the ingot from 1000° C. to 800° C. in a cooling time of 10 hours or more. In this method, cooling temperature of the ingot means temperature of the radial center of the ingot. The time for cooling from the above 1000° C. to 800° C. is more preferably 15 hours or more and 35 hours or less, and furthermore preferably from 20 hours or more and 30 hours or less.

Within the cooling of 1000° C. to 800° C., the temperature is substantially maintained within this temperature, even if there are some periods out of the upper limit or lower limit of this range during cooling due to sudden cooling environment fluctuation or the like, it is allowable. Even if a period out of the range occurs during cooling within the above temperature range, it is preferable that such period is within 20 minutes, particularly within 10 minutes in total.

In addition, in this method, the region of the ingot in the long axis direction where each of the interstitial oxygen concentration and the substitutional carbon concentration is within the above range is not limited as long as above features are satisfied, but it generally comprise the upper portion of the straight body portion of the ingot. In the produced single crystal silicon ingot, the carbon concentration can be appropriately adjusted by an impurity carbon content of raw material polycrystalline silicon, crucible material to be used, exhaust gas flow during pulling up, and the like.

A general ingot pulling up device used for the CZ method can be used without limitation. FIG. 7 shows a schematic view of a single crystal silicon ingot pulling up device according to a general CZ method.

In FIG. 7, a crucible 3 containing a silicon melt 2 and a melting heater 4 surrounding the crucible 3 are installed in a lower portion of a main chamber 1. Further, a single crystal pulling up shaft 6 including a seed crystal 5 at its tip end is hung down from an upper region of an inner space of the main chamber 1 so that the seed crystal 5 moves vertically to a length capable of contacting a surface of the silicon melt 2 contained in the crucible 3 in the main chamber 1. In the pulling up device having such a structure, after the crucible 3 is filled with raw material polycrystalline silicon, the raw material silicon is heated to a melting point or higher and melted by the melting heater 4, and then the single crystal pulling up shaft 6 is lowered, and the seed crystal 5 provided at the tip end is brought into contact with the surface of the silicon melt 2. When the seed crystal 5 is slowly pulled up after contact with the silicon melt surface, the silicon is solidified and grows into a crystal in its lower region, the silicon is cooled in a process of moving upward in the main chamber 1, and the single crystal silicon ingot 8 as the object can be produced.

In such a single crystal silicon ingot pulling up device, in order to take out the cooled single-crystal silicon ingot 8 out of the apparatus, an elongated cylindrical pull chamber 10 is connected upward from a central portion of a ceiling wall 9 of the main chamber 1. An opening portion is provided in an upper central portion of the ceiling wall 9 of the main chamber 1, and the pull chamber 10 is connected to the opening portion upward in a substantially vertical direction.

Below the pull chamber 10, a gate valve 11 for cutting off the inner space of the main chamber 1 and the inner space of the pull chamber 10 is provided, the cooled single crystal silicon ingot 8 is pulled up to the inside of the pull chamber 10 continuously, and is housed separately from the main chamber 1 since the gate valve 11 is closed. The inner diameter of the pull chamber 10 is determined by the diameter of a pulling up ingot, and is preferably provided by reducing diameter to 80% or less, more preferably 50% or less of the inner diameter of the main chamber 1. Then, by opening a part of the pull chamber 10 above the gate valve 11, the ingot 8 can be taken out of the device. A heat insulating material 7 is preferably provided between the melting heater 4 and the inner wall of the main chamber 1. A heat shielding device 15 may be provided in an upper space of the crucible 3.

In production of the single crystal silicon ingot in the present invention, a pulling up speed of the ingot is not particularly limited, and is generally preferably 0.6 mm/min to 2.5 mm/min, particularly preferably 0.8 mm/min to 1.5 mm/min.

In order to attain 10 hours or more of cooling time from 1000° C. to 800° C. of a region where each of the interstitial oxygen concentration and the substitutional carbon concentration satisfies the above range when pull up single crystal silicon ingot, each of temperature distribution in the ingot pulling up device and the length of the straight body portion of a single crystal silicon ingot to be pulled up, and a pulling up speed may be adjusted.

In the present invention, a method of determining temperature history of the ingot in cooling is not particularly limited. For example, as carried out in Examples that will be described later, it is preferable to perform actual single crystal growth and pulling up after temperature of the ingot is confirmed by a simulation experiment in which a pulling up operation is performed under various temperature conditions by using an ingot in which a thermocouple is embedded in advance. Specifically, according to a preferred method, a single crystal silicon ingot for temperature measurement simulation is produced under the same production conditions except that the R thermocouple is embedded in the radial center of a corresponding position of a region satisfying above-mentioned interstitial oxygen concentration and substitutional carbon concentration of the ingot, and the simulation of temperature history of the ingot is actually measured at the time of cooling. In addition, in accordance with actual measurement of the temperature history, it is also preferable to confirm accuracy of the actually measured value by using temperature of the center of the ingot in the diameter direction determined by a correlation from temperature simulation or temperature distribution in a furnace.

In production of the single crystal silicon, the productivity is improved by increasing the length of the ingot straight body portion and increasing the pulling up speed. In consideration of this, when a so-called long ingot having a long straight body portion is produced at a high pulling up speed, it is a more preferable to use an ingot pulling up device having a structure in which the upper portion of the straight body portion corresponding to the region where each of the interstitial oxygen concentration and the substitutional carbon concentration is satisfying the above range can be cooled to go through desired temperature history.

As an example of an aspect of an ingot pulling up device that can be used suitably in a case of producing such a long ingot at a high pulling up speed, as shown in FIG. 8, a pulling up device having such structure that an after-heater 12 is provided peripherally to heat the upper region of single crystal silicon ingot 8 which is pulled-up and entering into the pull chamber 10. With this device configuration, during the pulling up operation of the single crystal silicon ingot, the single crystal silicon ingot pulled up in the pull chamber is heated not to be lower than 800° C. until the pulling up operation of the ingot ends, and the time for cooling from 1000° C. to 800° C. can be set to a desired range.

As the after-heater 12, one same as those conventionally used as the melting heater 4 can be used without limitation, such as a resistance heater and a high-frequency heater. The heater temperature is generally adopted from 800° C. to 1100° C., but in order to make temperature of the single crystal silicon ingot not lower than 800° C., it is more preferable to set the heater temperature based on the actually measured temperature history of the silicon ingot.

An installation position of the after-heater 12 may be any position in the vertical direction in the pull chamber 10 so as to continuously or intermittently surround the entire circumference of the single crystal silicon ingot 8 in the horizontal direction of the pull chamber 10. When after-heater is provided over the entire circumference, it is preferable that the heater wire is provided peripherally by being wound in a screw shape in the vertical direction or being bent in a wave shape/zigzag shape to provide a constant width in the vertical direction of the pull chamber. It is also preferable to provide the heat insulating material 14 between the after-heater 12 and the inner wall of the pull chamber 10.

In order to slowly cool and maintain the temperature of the upper portion of the ingot which has passed through the main chamber 1 and entered the pull chamber 10 in a state of maintaining high temperature so as not to be lower than 800° C. during the pulling up operation of the ingot, the after-heater 12 is preferably provided in the lower region of the pull chamber 10. Specifically, the after-heater 12 is appropriately provided in a connection area 13 between the gate valve 11 of the pull chamber 10 and the ceiling wall 9 of the main chamber 1.

The length of the after-heater 12 in the vertical direction may be appropriately determined in consideration of the pulling up speed of the ingot and the temperature state of the ingot in the pull chamber depending on a length of the single crystal silicon ingot 8 to be heated and heat-kept against, but is generally 200 mm to 2000 mm, more preferably 400 mm to 1600 mm. A plurality of after-heaters may be provided in the vertical direction to control the ingot temperature more accurately.

The temperature of the ingot in the pulling up process of such a single crystal silicon ingot can be confirmed by measurement by embedding the R thermocouple in the center of the ingot as carried out in Examples that will be described later. In the present embodiment, in the radial center of the single crystal silicon ingot, a position of 20 mm downward from the upper end of the straight body portion of the ingot as a region in which the interstitial oxygen concentration in the crystal is 25 ppma to 45 ppma and the substitutional carbon concentration is 0.5 ppma or less is set as a temperature measurement position, but the temperature measurement position may be appropriately provided in accordance with change in the position of the above region.

In the pulling up device for the method of producing single crystal silicon of the present invention, not only the after-heater 12 is provided in the pull chamber 10, but also a heat insulating material, a heater, or the like may be provided in a space above the crucible 3 in order to control the temperature history in cooling of the single crystal silicon ingot 8 pulled up in the main chamber 1 to the desired temperature history.

In the method of producing single crystal silicon of the present invention, the length of the straight body portion of the ingot of single crystal silicon to be produced is not particularly limited, but is generally 600 mm to 2500 mm or more. Specifically, the length of the straight body portion of the ingot is 900 mm or more, more suitably a long length of 1100 mm to 2500 mm is desirable in view of improving productivity. The diameter of the ingot is preferably 100 mm to 300 mm, particularly more preferably 150 mm to 250 mm.

After cooling from 1000° C. to 800° C. at the predetermined time with regard to the region in which each of the interstitial oxygen concentration and the substitutional carbon concentration is in the above range in the long axis direction of the ingot, further cooling conditions of the ingot are not particularly limited. As described above, since a temperature range of less than 800° C., particularly a temperature range of 700° C. to 600° C. is a temperature range in which a large amount of nuclei of minute plate-shaped oxygen precipitates are formed, it is preferable to rapidly cool the temperature range of less than 800° C. as much as possible.

Therefore, in the process of pulling up a single crystal silicon ingot, during growth of the single crystal, that is, while a growth surface of the lower portion of the ingot is in contact with the silicon melt, the entire straight body portion of the ingot is maintained at 800° C. or higher, and when the growth ends, that is, after a tail is formed in the lower portion of the ingot and the ingot is detached from the silicon melt surface, the ingot is preferably pulled up at a higher speed than the pulling up speed during the crystal growth and rapidly cooled at a cooling speed that dislocations due to thermal shock do not occur in the crystal. The cooling speed at this time is preferably 3° C./min to 20° C./min, particularly 5° C./min to 15° C./min.

The rapid cooling is preferably carried out by stopping heating by the after-heater after formation of the tail portion of the single crystal silicon ingot and detachment of the melt, pulling up the entire ingot into the pull chamber, isolating the ingot from the main chamber, and blocking radiant heat and the like. This makes it possible to rapidly cool the entire ingot until it reaches the upper portion of the straight body portion of the ingot, and to efficiently produce a single crystal silicon ingot having a small number of oxygen precipitates formed in the temperature range of less than 800° C.

When the ingot in the pull chamber is rapidly cooled, it is also a good aspect to accelerate convective heat transfer to improve cooling efficiency by supplying an inert gas into the pull chamber.

Regarding the CZ method single crystal silicon ingot produced as described above, the single crystal silicon plate-shaped body of the present invention can be obtained by quarrying the single crystal silicon into a plate shape from a long axis direction region in which an interstitial oxygen concentration is 25 ppma to 45 ppma and a substitutional carbon concentration is 0.5 ppma or less in the radial center.

As outlined above, the oxygen precipitates generated in a heating process at the time of device production are classified into two types according to the cooling conditions at the time of ingot production. A first type of oxygen precipitates have a polyhedral structure and are relatively large in size. A second type of oxygen precipitates are plate-shaped and relatively small in size. The first type of oxygen precipitates have a crystal habit similar to that of silicon crystals and have few contributions to generation of dislocations. On the other hand, the second type of oxygen precipitates are easy to be a starting point for generating dislocations. The present invention has been made based on these findings, and by controlling the cooling conditions at the time of ingot production, the generation of the first type of oxygen precipitates is dominant.

That is, a single crystal silicon plate-shaped body according to the first aspect of the present invention is a single crystal silicon plate-shaped body, in which an interstitial oxygen concentration in a crystal is 25 ppma to 45 ppma and a substitutional carbon concentration is 0.5 ppma or less in the radial center, and in the radial center, oxygen precipitates are not observed in a bulk in an image of 200,000 times by means of a transmission electron microscope, and after heating the single crystal silicon plate-shaped body at 950° C. for 60 minutes, oxygen precipitates are observed in an image of the 200,000 times, and a shape of the oxygen precipitates is observed in a polyhedral structure in an image of 2,000,000 times.

Even if the first type of oxygen precipitates are generated, since the size is relatively large, the number density is small and an influence on the generation of dislocations is small. To the contrary, the second type of oxygen precipitates are relatively small in size, the number density is high and dislocations are easily generated. Therefore, when viewed from another side, the single crystal silicon plate-shaped body of the present invention is a single crystal silicon plate-shaped body, in which an interstitial oxygen concentration in a crystal is 25 ppma to 45 ppma and a substitutional carbon concentration is 0.5 ppma or less in the radial center, and in the radial center, oxygen precipitates are not observed in a bulk in an image of 200,000 times by means of a transmission electron microscope, and after heating the single crystal silicon plate-shaped body at 950° C. for 60 minutes, oxygen precipitates are observed in an image of the 200,000 times, and a major axis of the oxygen precipitate is 20 nm to 100 nm.

EXAMPLES

Examples of the present invention are exemplified and described in more details below, but the present invention is not limited thereto. Observation of oxygen precipitates was measured by the following method.

1) Interstitial Oxygen Concentration and Substitutional Carbon Concentration in Single Crystal Silicon In single crystal silicon produced in the following Examples, an upper end sample having a thickness of 2.5 mm including an ingot center was quarried from an upper end of an ingot straight body portion. A φ10 mm test piece was quarried from the ingot center and finished to a mirror surface by mechanical grinding to have a thickness of 2 mm to be a measurement sample. An interstitial oxygen concentration was measured by a Fourier transform infrared spectrophotometer under ASTM F 121-79.

A substitutional carbon concentration was measured by a Fourier transform infrared spectrophotometer under ASTM F 123-86 by using the measurement sample. In a case where the substitutional carbon concentration is 0.04 ppma or less, since sufficient measurement accuracy cannot be obtained, measurement samples were also quarried from a middle portion or a lower end side of the ingot straight body portion having a high carbon concentration, the substitutional carbon concentration at the middle or lower portion was measured with the same method, and the substitutional carbon concentration at an upper portion of the straight body portion of the ingot was determined by calculation based on a carbon segregation coefficient and a solidification rate of crystal weight to the acquisition position of the sample and the weight of a polycrystalline silicon raw material filled in a crucible.

2) Observation of Oxygen Precipitates in Single Crystal Silicon Bulk

Two sample substrates obtained from an adjacent position within the single crystal silicon ingot produced in each Example were used for transmission electron microscope observation. One of the sample substrates was not subjected to heating treatment, and was a sample substrate to be observed with a transmission electron microscope in a bulk.

After heated at a temperature of 950° C. for 60 minutes, the other sample substrate was a sample substrate to be observed with a transmission electron microscope in a bulk. Each sample substrate was cut into 50 mm×50 mm including an ingot center and immersed in a mixed acid (48 wt % hydrofluoric acid: 60 wt % nitric acid=1:2), and a damaged layer by slicing the substrate surface was removed and immediately rinsed with hydrogen fluoride water (the same 48 wt % hydrofluoric acid:ultrapure water=1:9) to make the surface hydrophobic. At this time, a substrate sample surface was a glossy surface. After washing twice with pure water, moisture adhering to the surface was sufficiently removed to obtain a sample for heating treatment. The heating treatment was performed in an argon atmosphere using a clean quartz annular furnace at a temperature of 950° C. for 60 minutes.

An ultrathin section sample for transmission electron microscope observation was manufactured from each sample substrate by the following method. The substrate sample was cleaved, and the ultrathin sections were processed in parallel to a (110) surface as a cleavage surface by an ion milling method. The thickness of the ultrathin section was adjusted to be about 30 nm from equal thickness interference fringes in transmission electron microscope observation.

A spherical aberration correction transmission electron microscope ARM200F manufactured by JEOL equipped with two spherical aberration correction devices (Cs collectors) for a transmission electron microscope and a scanning transmission electron microscope was used for the transmission electron microscope observation of oxygen precipitates. A transmission electron microscope function was used at a low magnification of 20,000 times by changing visual fields within the ultrathin section sample, a range of 10 visual fields in total, namely about 9 μm×9 μm×10 visual fields was first observed, and a minute dark shadow (black dot) observed therein was searched.

Next, by increasing the magnification up to 200,000 times by focusing on the shadow, it is confirmed whether the shadow is a shadow generated due to the distortion accompanying with the oxygen precipitates which will be described later. From among all distortions present in the range of about 9 μm×9 μm×10 visual fields, 20 distortions were selected randomly and observed at 200,000 times respectively, and it was evaluated that the oxygen precipitates were observed when there is at least one distortion accompanying with the oxygen precipitates.

When the oxygen precipitates are confirmed, after an observation magnification was gradually increased to 2,000,000 times while focusing on the oxygen precipitate, the shape and major axis of the oxygen precipitates were measured by photographing a scanning transmission electron microscope-bright field image (STEM-BF image) and a scanning transmission electron microscope-high angle annular dark field image (STEM-HAADF image) by switching to the scanning transmission electron microscope function.

When 10 of the oxygen precipitates (when less than 10, all of them) are observed and even one of them has a polyhedral structure, it was evaluated that oxygen precipitate having a polyhedral shape was formed. In addition, the size of those having a polyhedral shape was determined as an average value of the major axes of 10 (when less than 10, all of them) polyhedral structures.

3) Measurement of Density of Oxygen Precipitates

Density of oxygen precipitates was measured by using the ultrathin section sample used in observation of oxygen precipitates in the above 2). An image of 25,000 times was photographed using the transmission electron microscope H-9000NAR manufactured by Hitachi High-Technologies Corporation. Black dots derived from the distortion of oxygen precipitates observed in an image of 7.24 μm×8.00 μm were counted, and the number density of black dots was determined from the volume (7.24 μm×8.00 μm×sample thickness 30 nm) of an observation visual field.

Here, in a case where substantially all of the confirmed distortions (black dots) are oxygen precipitates in accordance with the observation of the oxygen precipitates at 200,000 times described in the above 2), the number density of the black dots was deemed as the number density of the oxygen precipitates. In a case where not only oxygen precipitates, but defects that are not oxygen precipitates, such as voids or scratches on a sample are confirmed when the distortions are observed at 200,000 times, the number density of oxygen precipitates is obtained by multiplying the number density of black dots by a proportion of oxygen precipitates among confirmed distortions. Observation was made in 10 visual fields and the average value was taken as the density of oxygen precipitates. The thickness of the ultrathin section sample was confirmed by equal thickness interference fringes of a TEM image.

4) Evaluation of Solar Cell Properties

A sample substrate (156 mm×156 mm×t 205 μm) obtained from the single crystal silicon ingot produced in each Example, an n-type diffusion/double-side light-receiving solar cell was produced in the following process to evaluate cell properties. First, texture treatment was applied by etching to a substrate, then boron diffusion treatment at 950° C. or higher, formation of a dopant diffusion layer by phosphorus diffusion treatment at 850° C. or higher, thermal oxidation at 850° C., and surface passivation by a silicon nitride film formation are performed, and a silver paste electrode was printed and fired to produce a general double-side light-receiving solar cell. The evaluation of the solar cell properties was based on cell conversion efficiency by I-V characteristic evaluation and an open-circuit voltage having a large lifetime dependence which indicates a quality of the substrate crystal. The conversion efficiency and the open-circuit voltage adopted average values on five adjacent substrates.

5) Lifetime of Substrate after Device Formation

A bulk quality of a substrate after device formation was evaluated by lifetime. In accordance with the solar cell production process described in 4), the substrate immediately after the silicon nitride film formation before formation of the silver paste electrode was produced for evaluation. The substrate was immersed in a mixed acid (48 wt % hydrofluoric acid: 60 wt % nitric acid=1:2) to completely remove a dopant diffusion layer, an oxidation layer, and a silicon nitride film, and immediately rinsed with hydrogen fluoride water (the same 48 wt % hydrofluoric acid:ultrapure water=1:9) to make the surface hydrophobic. Then, a quinhydrone/methanol solution was applied to perform chemical passivation treatment, and the lifetime of the substrate was measured by a μ-PCD method with a lifetime measuring device (WT-2000 manufactured by SEMILAB). The entire surface of the substrate was measured at intervals of 2 mm, and an average value of the entire substrate was adopted as a lifetime value.

Example 1

A single crystal silicon was produced using an ingot pulling up device shown in FIG. 8. In this ingot pulling up device, a whole length of a pull chamber 10 (a length from the upper end thereof to a ceiling wall 9 of a main chamber 1) was 5100 mm, a length above a gate valve 11 in which an ingot is entered at the end of pulling up was 3500 mm, and an inner diameter of this region was 380 mm. A length of a connection area 13 to the main chamber 1 interposed below the gate valve 11 was 1600 mm.

In the pull chamber 10, a connection area 13 to the main chamber 1 interposed below the gate valve 11 is larger in diameter than an inner diameter above the gate valve 11, and an after-heater 12 is installed in the enlarging diameter portion. The after-heater 12 is a cylindrical resistance heating heater made of graphite having an inner diameter of 380 mm and a length of 1200 mm, and is arranged peripherally along an inner wall of the pull chamber 10.

A heat insulating material 14 is provided between the after-heater 12 and the inner wall of the pull chamber 10.

A crucible 3 installed in the main chamber 1 is made of quartz and has a diameter of 24 inches (610 mm), and when 150 kg of a high-purity polycrystalline silicon raw material and these high-purity polycrystalline silicon melt, an n-type silicon dopant was adjusted and housed so as to be dissolved in the silicon melt such that 74 ppba of phosphorus (a concentration at which specific resistance is 3.0 Ω·cm to 3.5 Ω·cm on an upper end side of a straight body portion of the ingot) in the silicon melt 2 is dissolved.

The inside of the main chamber 1 was depressurized to several kPa with a vacuum pump, power is applied to a melting heater 4 made of graphite and the melting heater 4 was heated to 1450° C. to heat and melt the polycrystalline silicon in an argon atmosphere. A single crystal pulling up shaft 6 provided with a silicon seed crystal 5 at a tip end having a main surface orientation Si<100> was lowered, the silicon seed crystal 5 is brought into contact with a liquid surface of the silicon melt 2, and the melting heater 4 was adjusted to a temperature at which a solid-liquid interface grows into a crystal. Thereafter, the pulling up of the single crystal is started at a pulling up speed of 0.9 mm/min, the straight body portion has a diameter of 9 inches (225 mm) and a length of 1350 mm, a shoulder portion has a length of 100 mm, and a tail portion has a length of 200 mm, and an n-type single crystal silicon ingot having a crystal growth orientation <100> was pulled up.

After the start of pulling up, an amount of the silicon melt 2 in the crucible 3 decreases. Accordingly, the crucible 3 was raised in order to keep a distance from the silicon melt surface in the crucible to the main chamber ceiling wall constant. At the start of pulling up, a height difference between an upper end of the crucible 3 and an uppermost portion of the ceiling wall of the main chamber 1 was 700 mm.

Cooling of the pulled-up single crystal silicon ingot was carried out at a cooling speed of 0.1° C./min to 2.7° C./min at an upper portion of the straight body portion from the melt surface to an entry position into the pull chamber. Since the ingot to be pulled up has a long length of 1650 mm as described above, the upper portion of the straight body portion entered into the pull chamber 10 when pulled up to 850 mm or more.

Power was applied to the after-heater 12 from 300 mm before the upper portion of the straight body portion approaching the connection area 13, which is entering into the pull chamber 10. After the temperature of the upper portion of the straight body portion entering the pull chamber decreased to around 850° C., the temperature was kept so as not to be lower than this. A heating temperature of the after-heater 12 was grasped by a K thermocouple inserted in the vicinity of the heater, and the temperature of the after-heater was adjusted.

After the ingot has been pulled up, a tail of the ingot was detached from the melt, and simultaneously the single crystal silicon ingot was raised at a speed of 500 mm/min.

After a lower end of the tail portion of the ingot reached above the gate valve, the gate valve was closed to block radiant heat from the main chamber to rapidly cool the ingot. At this time, by introducing argon to atmospheric pressure, convective heat transfer was promoted to improve a rapid cooling effect of the ingot.

After the above operation, the pull chamber above the gate valve 11 was opened to take the single crystal silicon ingot 8 out of the pulling up device. A substitutional carbon concentration at an upper end of the shoulder portion of the taken out single crystal silicon ingot was measured, a carbon concentration in the silicon melt at the start of pulling up the ingot was determined from a solidification rate based on the measured value, and the carbon concentration was taken as an index of a carbon concentration in the used polycrystalline silicon raw material. The carbon concentration in the silicon melt at the start of the determined pulling up was shown in Table 1.

In order to confirm the temperature history of the upper portion of the ingot straight body portion in the pulling up operation of the single crystal silicon ingot, the following experiments were carried out separately. That is, the single crystal silicon ingot was pulled up by the same method as described above except that a thick seed crystal for temperature measurement was attached to the seed crystal 5 provided at the tip end of the ingot pulling up shaft 6 and the R thermocouple placed in an alumina tube was provided so as to protrude downward by 50 mm. In the pulled-up single crystal silicon ingot, the R thermocouple was embedded in a position of 20 mm downward from the start of the straight body portion of the ingot center.

During the pulling up operation of the ingot, by acquiring data of a temperature of the R thermocouple at an interval of 1 minute, a temperature change in the radial center 20 mm below the straight body upper end portion of the ingot was confirmed. In a process of pulling up the ingot at 0.9 mm/min, an indication temperature of the R thermocouple is gradually decrease along with pulling up from a solidification position of the crystal, but since the temperature is kept with the after-heater even after the R thermocouple enters the pull chamber, the temperature was maintained at 800° C. or higher and was not lower than 800° C. to a total length of the ingot of 1650 mm, that is, to a position where the ingot is detached from the melt interface. Time from 1000° C. at this time to the detachment of the ingot, that is, time for cooling from 1000° C. to 800° C. was 25.4 hours. Subsequently, the ingot was cooled rapidly at about 8° C./min in pulling up at 500 mm/min after detachment from the melt interface.

In the single crystal silicon ingot produced by the above method, the shoulder portion and the tail portion were cut and detached, and a circular plate shaped sample having a thickness of 2.5 mm was quarried from the upper end of the obtained straight body portion, and the interstitial oxygen concentration and the substitutional carbon concentration of the upper end portion of the single crystal silicon were measured according to the method in the above 1). The results were shown in Table 1.

Next, the entire remaining portion of the straight body portion was cut into a 156 mm×156 mm prism (brick), and then was sliced for a solar cell substrate (wafer) with a fixed abrasive wire using a multi-wire saw. The thickness of the substrate was 205±10 µm. Two of the single crystal silicon substrates obtained from adjacent upper end portions were used as sample substrates for physical property measurement in the above 2). In addition, a sample substrate obtained from subsequent lower portions were subjected to measurement of other physical properties. The shape, average major axis, and number density of oxygen precipitates in a bulk were measured according to the above 2) and 3) using these sample substrates. Further, the conversion efficiency and the open-circuit voltage of the n-type diffusion solar cell and a lifetime of a substrate after forming a solar cell device were evaluated according to the methods 4) and 5). The results were shown in Table 1 separately.

In 2) "observation of oxygen precipitates in single crystal silicon bulk", substantially all of the distortions that can be confirmed by observation at 200,000 times by a transmission electron microscope were oxygen precipitates. In addition, FIG. 1 and FIG. 2 showed images obtained by observation at 2,000,000 times by a transmission electron microscope. The images are (a) TEM image, (b) STEM-BF image, and (c) STEM-HAADF image, respectively. In (a) TEM image, oxygen precipitates extending 50 nm to 60 nm in a horizontal direction can be observed, and it was confirmed that the shape was an octahedral shape that extends long in the horizontal direction, although the surroundings are dark and distortions overlap.

In (b) STEM-BF image (imaging transmitted electrons by scanning a narrowed electron beam through a sample), an influence of distortions was small, the shape of oxygen precipitates could be clearly confirmed, and since contrast of the image was strong, the octahedral shape could be confirmed more clearly. Since the octahedral oxygen precipitates had a crystal habit of a silicon crystal and extends long in the horizontal direction in the image, that is, in a <110> direction, the major axis of the oxygen precipitate was recognized to be 58.3 nm in a sample by measurement from the image. Table 1 showed an average value of major axes of the observed 10 oxygen precipitates. In addition, the octahedral shape in the image can be clearly confirmed by (c) STEM-HAADF image (imaging electrons scattered at a high angle) and atomic number contrast appears in this image, the image of the precipitates was darker than that of mother phase silicon and lighter composition, and thus the precipitates could be confirmed as oxygen precipitates. The octahedral shape of such oxygen precipitates was the same in all of the observed 10 oxygen precipitates.

Comparative Example 1

A single crystal silicon ingot was produced in the same way as in the Example 1 except that in the device of FIG. 8, a device not provided with an after-heater 12 in a pull chamber 10 was used as an ingot pulling up device.

When the ingot was pulled up to 850 mm or more, an upper portion of an ingot straight body portion entered into the pull chamber 10, but the after-heater 12 is not provided in the pull chamber 10. Therefore, the upper portion of the straight body portion was cooled to around 600° C. as it is, and time for cooling from 1000° C. to 800° C. was 8.3 hours.

As a result, physical properties of the obtained single crystal silicon ingot were measured according to methods in the above (1) to (5). The results were shown in Table 1.

In 2) "observation of oxygen precipitates in single crystal silicon bulk", substantially all of the distortions that can be confirmed by observation at 200,000 times by a transmission electron microscope were oxygen precipitates. In addition, FIG. 3 and FIG. 4 showed images [(a) TEM image, (b) STEM-BF image, (c) STEM-HAADF image] obtained by observation at 2,000,000 times by a transmission electron microscope in "2) Observation of oxygen precipitates in single crystal silicon bulk". Complex distortion was observed in the TEM image of (a), and a dislocation loop was also observed. Although its shape is not clear, it could be confirmed that very thin plate-shaped oxygen precipitates having a thickness of 1 nm or less were aligned and a dislocation complex was formed as indicated by an arrow in the image. Even in b) STEM-BF image, strong distortion was observed, and it was confirmed more clearly that the precipitate image is the plate shape. Since the major axis had a shape extending long in a <111> direction of an oblique direction in the image, the major axis was 12.8 nm in a sample measured from the image. Further, even in the STEM-HAADF image of (c), it was clearly confirmed that the image of the precipitates had a plate-like shape. The plate shape of such oxygen precipitates was the same in all of the observed 10 oxygen precipitates.

Example 2 and Comparative Examples 2 and 3

A single-crystal silicon ingot was produced in the same manner as in Example 1 except that a polycrystalline silicon raw material having a different carbon concentration was used such that a carbon concentration in a silicon melt at the start of pulling up an ingot is a value shown in Table 1, and time for cooling from 1000° C. to 800° C. in a cooling process of the ingot was also changed to a value shown in Table 1. Results in 1) to 5) of measuring physical properties of the obtained single crystal silicon were shown in Table 1.

As is clear from Table 1, the single crystal silicon plate-shaped body quarried from an upper portion of a straight body portion of a single crystal silicon ingot produced in Examples 1 and 2 exhibited properties in which an interstitial oxygen concentration was at a high value exceeding 25 ppma in the radial center, a substitutional carbon concentration was at 0.3 ppma or less, and oxygen precipitates were not observed in the bulk, and oxygen precipitates having a polyhedral structure were observed in a bulk after heated at 950° C. for 60 minutes. These were devices having excellent conversion efficiency and an open-circuit voltage as solar cell devices and having a high value of lifetime.

In contrast, a single crystal silicon plate-shaped body quarried in the same manner as a single crystal silicon ingot produced in Comparative Examples 1 and 2 had a large difference in that the shape of oxygen precipitates precipitated by heating treatment at 950° C. for 60 minutes was plate-shaped compared with those in the Examples 1 and 2, and the properties as the solar cell device were much inferior to those in the above Examples.

Further, as compared with those in the Examples 1 and 2, a single crystal silicon plate-shaped body quarried in the same manner as a single crystal silicon ingot produced in Comparative Example 3 had a large difference in that the substitutional carbon concentration was 1.35 ppma, and when much carbon is contained, even if the shape of the oxygen precipitates by the heating treatment is a polyhedron, since the size is relatively small and the number density is high, and dislocations are easily generated, properties of the device are much inferior to those of the above examples.

Examples 3 and 4 and Comparative Example 4

A single-crystal silicon ingot was produced in the same manner as in Example 1 except that a polycrystalline silicon raw material having a different carbon concentration was used such that a carbon concentration in a silicon melt at the start of pulling up an ingot is a value shown in Table 2, and time for cooling from 1000° C. to 800° C. in a cooling process of the ingot was also changed to a value shown in Table 2. Results in 1) to 5) of measuring physical properties of the obtained single crystal silicon were shown in Table 2.

TABLE 1

| | Carbon concentration in silicon melt at the start of pulling up (ppma) | Time for cooling from 1000° C. to 800° C. in ingot production (hours) | Interstitial oxygen concentration (ppma) | Substitutional carbon concentration (ppma) | Oxide precipitates before heating treatment | Oxide precipitates after heating treatment | | Solar cell evaluation (straight body upper end portion) | | |
|---|---|---|---|---|---|---|---|---|---|---|
| | | | | | | Shape | Average major axis (nm) | Number density (pieces/cm$^3$) | Conversion efficiency (%) | Open-circuit voltage (mV) | Lifetime (μsec) |
| Example 1 | 1.8 | 25.4 | 38.6 | 0.13 | Not observed | Polyhedron | 52 | $1.4 \times 10^{12}$ | 17.70 | 629.2 | 39.7 |
| Comparative Example 1 | 1.2 | 8.3 | 41.8 | 0.09 | Not observed | Plate shape | 12 | $7.5 \times 10^{12}$ | 15.75 | 590.5 | 11.8 |
| Example 2 | 0.8 | 25.4 | 40.5 | 0.06 | Not observed | Polyhedron | 68 | $4.1 \times 10^{11}$ | 18.10 | 634.2 | 45.3 |
| Comparative Example 2 | 0.4 | 8.3 | 41.9 | 0.03 | Not observed | Plate shape | 17 | $2.1 \times 10^{12}$ | 15.79 | 595.6 | 13.4 |
| Comparative Example 3 | 18.8 | 25.4 | 40.9 | 1.35 | Not observed | Polyhedron | 12 | $3.1 \times 10^{13}$ | 13.71 | 559.6 | 3.4 |

TABLE 2

| | Carbon concentration in silicon melt at the start of pulling up (ppma) | Time for cooling from 1000° C. to 800° C. in ingot production (hours) | Interstitial oxygen concentration (ppma) | Substitutional carbon concentration (ppma) | Oxide precipitates before heating treatment | Oxide precipitates after heating treatment | | | Solar cell evaluation (straight body upper end portion) | | |
|---|---|---|---|---|---|---|---|---|---|---|---|
| | | | | | | Shape | Average major axis (nm) | Number density (pieces/cm$^3$) | Conversion efficiency (%) | Open-circuit voltage (mV) | Lifetime (μsec) |
| Example 3 | 2.9 | 25.4 | 40.2 | 0.21 | Not observed | Polyhedron | 44 | 2.3 × 10$^{12}$ | 16.91 | 616.3 | 20.3 |
| Example 4 | 5.7 | 25.4 | 39.8 | 0.41 | Not observed | Polyhedron | 28 | 6.9 × 10$^{12}$ | 15.94 | 596.8 | 8.7 |
| Comparative Example 4 | 3.2 | 8.3 | 40.9 | 0.22 | Not observed | Plate shape | 18 | 2.5 × 10$^{13}$ | 14.87 | 572.8 | 6.7 |

As is clear from Table 2, compared with the single crystal silicon plate-shaped body in the Example 1, it was different that a single crystal silicon plate-shaped body quarried from an upper portion of a straight body portion of a single crystal silicon ingot produced in Examples 3 and 4 had a substitutional carbon concentration of 0.21 ppma in Example 3 and 0.41 ppma in Example 4, and both of them were slightly higher. On the other hand, in a single crystal silicon plate-shaped body in Comparative Example 4 in which oxygen precipitates precipitated by heating treatment at 950° C. for 60 minutes have a plate shape, the substitutional carbon concentration was similarly increased to 0.22 ppma.

In comparison between the Example 3 and Comparative Example 4 in which the substitutional carbon concentration is the same, properties as a solar cell device in Example 3 was considerably higher, and even in comparison between the Example 4 and Comparative Example 4 where the substitutional carbon concentration was significantly high in Example 4, properties as a solar cell device in Example 4 was higher. Therefore, it was confirmed that even if the substitutional carbon concentration in this range (0.5 ppma or less) was slightly improved, the solar cell device in which the shape of the oxygen precipitates precipitated by the heating treatment is a polyhedron showed better properties as compared with the solar cell device in which the oxygen precipitates have the plate shape.

Example 5 and Comparative Example 5

In Example 1, octahedral oxygen precipitates observed by a transmission electron microscope at 2,000,000 times under "2) Observation of oxygen precipitates in single crystal silicon bulk" were further observed at a high magnification of 8,000,000 times. The results were shown in FIG. 5. In (a) TEM image, an observed enlarged position was indicated by an arrow. An edge portion of the oxygen precipitates in which stress easily concentrates due to growth of the oxygen precipitates was observed in an enlarged manner. In both (b) STEM-BF image and (c) STEM-HAADF image, a lattice image of a silicon crystal was observed, and lattice disorder could be observed at a position of the oxygen precipitates and surroundings thereof. In a mother phase portion of the silicon crystal in (c) STEM-HAADF image, a dumbbell structure in which silicon atom columns were paired was also observed, whereby distortions of the crystal lattice could be easily observed.

Similarly, the plate-shaped oxygen precipitates observed in Comparative Example 1 was observed at 8,000,000 times. The results were shown in FIG. 6. In (a) TEM image, an observed enlarged position was indicated by an arrow. The vicinity of a dislocation loop formed from the oxygen precipitates observed in the TEM image was observed in an enlarged manner. In (b) STEM-BF image and (c) STEM-HAADF image, the lattice disorder was large, and when compared with an electron microscope observation image (FIG. 5) of the oxygen precipitates in the Example 1, it was judged that the unclear area of a lattice image was wide, that is, the lattice disorder was large.

Reference Example 1

In Example 1, an experiment of confirming temperature history of an ingot straight body portion, which is performed separately from a pulling up operation of a single crystal silicon ingot, was changed and performed as follows. That is, in the single crystal silicon ingot to be pulled up, a length of an R thermocouple provided below a seed crystal for temperature measurement at an tip end of an ingot pulling up shaft 6, which protrudes downward was changed to 330 mm, and the R thermocouple was embedded in a position of 300 mm below a start position of the straight body portion in the center of the ingot. From this confirmation experiment, it was confirmed that time for cooling from 1000° C. to 800° C. of a position of the radial center provided with the R thermocouple in the straight body portion of the crystal silicon ingot produced in Example 1 was 20.2 hours.

Then, the single crystal silicon ingot was produced in the same way as in Example 1, and physical properties of the straight body portion of the obtained ingot in each of 1) to 5) were measured taking the vicinity of an equivalent position provided with the R thermocouple as a target. The results were shown in Table 1.

TABLE 3

| | Carbon concentration in silicon melt at the start of pulling up (ppma) | Time for cooling from 1000° C. to 800° C. in ingot production (hours) | Interstitial oxygen concentration (ppma) | Substitutional carbon concentration (ppma) | Oxide precipitates before heating treatment | Oxide precipitates after heating treatment | | | Solar cell evaluation (straight body upper end portion) | | |
|---|---|---|---|---|---|---|---|---|---|---|---|
| | | | | | | Shape | Average major axis (nm) | Number density (pieces/cm$^3$) | Conversion efficiency (%) | Open-circuit voltage (mV) | Lifetime (μsec) |
| Reference Example 1 | 1.8 | 20.2 | 24.1 | 0.17 | Not observed | Not observed | | | 19.08 | 645.1 | 412.9 |

As is clear from Table 3, even in a single crystal silicon ingot produced under the same conditions as the single crystal silicon ingot obtained in Example 1, the interstitial oxygen concentration was reduced to be less than 25 ppma when a single crystal silicon plate-shaped body was quarried from a middle portion of the straight body portion. Thus, when the oxygen concentration is small, the oxygen precipitates were not substantially precipitated by heating treatment at 950° C. for 60 minutes, and there was no problem of lowering properties of the solar cell device.

REFERENCE SIGNS LIST

1: main chamber
2: silicon melt
3: crucible
4: melting heater
5: seed crystal
6: single crystal pulling up shaft
7: heat insulating material (main chamber)
8: single crystal silicon ingot
9: ceiling wall
10: pull chamber
11: gate valve
12: after-heater
13: connection area between gate valve and main chamber
14: heat insulating material (pull chamber)
15: heat shielding device

The invention claimed is:

1. A single crystal silicon plate-shaped body, wherein
an interstitial oxygen concentration in a crystal is 25 ppma to 45 ppma and a substitutional carbon concentration is 0.5 ppma or less in a radial center, and
in the radial center, oxygen precipitates are not observed in a bulk in an image of 200,000 times by a transmission electron microscope, and
after heating the single crystal silicon plate-shaped body at 950° C. for 60 minutes, oxygen precipitates are observed with number density of $1.0 \times 10^{11}$ to $2 \times 10^{12}$ pieces/cm$^3$, and
when the oxygen precipitates are observed in an image of 2,000,000 times, oxygen precipitates of which a shape is observed in a polyhedral structure are 75% or more.

2. The single crystal silicon plate-shaped body according to claim 1, wherein the substitutional carbon concentration is 0.001 ppma to 0.3 ppma.

3. The single crystal silicon plate-shaped body according to claim 1, wherein the single crystal silicon plate-shaped body is quarried from a CZ method single crystal silicon ingot and is not subjected to thermal history at 900° C. or higher after quarrying.

4. The single crystal silicon plate-shaped body according to claim 3, wherein the single crystal silicon plate-shaped body is quarried from an upper portion of a straight body portion of the CZ method single crystal silicon ingot.

5. The single crystal silicon plate-shaped body according to claim 1, wherein the polyhedral structure is an octahedron.

6. The single crystal silicon plate-shaped body according to claim 1, wherein the number density of oxygen precipitates is calculated by:
confirming substantially all distortions in an image at 200,000 times are oxygen precipitates; and
measuring a number density of distortions at 10,000-50,000 times which are observed as black dots, wherein the number density of distortions is the number density of oxygen precipitates.

7. The single crystal silicon plate-shaped body according to claim 1, wherein the number density of oxygen precipitates is calculated by:
confirming distortions in an image at 200,000 times are oxygen precipitates and defects;
measuring a number density of distortions at 10,000-50,000 times which are observed as black dots; and
multiplying a proportion of oxygen precipitates among the confirmed distortions by the measured number density of black dots.

8. A CZ method single crystal silicon ingot comprising:
a region which satisfies properties of the single crystal silicon plate-shaped body according to claim 1 in a long axis direction of the ingot.

9. A single crystal silicon ingot, comprising:
a region which satisfies properties of the single crystal silicon plate-shaped body according to claim 1 in an upper portion of a straight body portion.

10. A single crystal silicon body, comprising:
a single crystal silicon body having an interstitial oxygen concentration of 30 ppma to 45 ppma and a substitutional carbon concentration of 0.001 ppma to 0.5 ppma in a radial center, and
oxygen precipitates having a number density of $1.0 \times 10^{11}$ to $2 \times 10^{12}$ pieces/cm$^3$ in the radial center, wherein 75% or more of the oxygen precipitates have a polyhedral structure when observed in an image of 2,000,000 times by a transmission electron microscope.

* * * * *